United States Patent
Mitsuyama et al.

(10) Patent No.: US 9,678,164 B2
(45) Date of Patent: Jun. 13, 2017

(54) BATTERY INTERNAL STATE ESTIMATING APPARATUS AND BATTERY INTERNAL STATE ESTIMATING METHOD

(75) Inventors: Taiji Mitsuyama, Tokyo (JP); Takezo Sugimura, Tokyo (JP); Etsuzo Sato, Tokyo (JP); Antal Kovats, Budapest (HU)

(73) Assignees: Furukawa Electric Co., Ltd., Chiyoda-ku, Tokyo (JP); Furukawa Automotive Systems Inc., Inukami-gun, Shiga (JP)

( * ) Notice: Subject to any disclaimer, the term of this patent is extended or adjusted under 35 U.S.C. 154(b) by 815 days.

(21) Appl. No.: 13/636,653

(22) PCT Filed: Nov. 12, 2010

(86) PCT No.: PCT/JP2010/070186
§ 371 (c)(1),
(2), (4) Date: Jan. 8, 2013

(87) PCT Pub. No.: WO2011/118080
PCT Pub. Date: Sep. 29, 2011

(65) Prior Publication Data
US 2013/0110429 A1    May 2, 2013

(30) Foreign Application Priority Data

Mar. 23, 2010 (JP) ................................. 2010-065801
Mar. 31, 2010 (JP) ................................. 2010-080303

(51) Int. Cl.
*G01R 31/36* (2006.01)
*H01M 10/48* (2006.01)
(Continued)

(52) U.S. Cl.
CPC ..... *G01R 31/3606* (2013.01); *G01R 31/3651* (2013.01); *G01R 31/3679* (2013.01);
(Continued)

(58) Field of Classification Search
CPC .......................... G01R 31/3606; G06F 17/00
(Continued)

(56) References Cited

U.S. PATENT DOCUMENTS

2002/0003417 A1*  1/2002  Bito et al. ...................... 320/152
2003/0069704 A1*  4/2003  Bean .............................. 702/63
(Continued)

FOREIGN PATENT DOCUMENTS

DE    10 2005 031254 A1    1/2007
EP         1 972 956 A1    9/2008
(Continued)

OTHER PUBLICATIONS

Supplementary Partial European Search Report received in corresponding European Application No. 10 84 8472.6 dated Apr. 20, 2017.

*Primary Examiner* — John Breene
*Assistant Examiner* — Yaritza H Perez Bermudez
(74) *Attorney, Agent, or Firm* — Knobbe, Martens, Olson & Bear, LLP

(57) ABSTRACT

To learn a parameter of a simulation model of a battery efficiently. A battery internal state estimating apparatus, estimating an internal state of a battery based on a simulation model of the battery, includes a storing section (RAM10c) that stores a plurality of parameters of the simulation model, a detecting section (I/F10d) that detects a discharge current flowing from the battery to a load, a selecting section (CPU 10a) that selects a parameter to be subjected to adaptive learning based on a value of the discharge current detected by the detecting section, and an adaptive learning section (CPU 10a) that performs adapting learning on a parameter selected by the selecting section.

20 Claims, 17 Drawing Sheets

(51) Int. Cl.
*G06F 17/00* (2006.01)
*H01M 10/06* (2006.01)

(52) U.S. Cl.
CPC ............ *G06F 17/00* (2013.01); *H01M 10/48* (2013.01); *H01M 10/06* (2013.01)

(58) Field of Classification Search
USPC .......................................................... 702/63
See application file for complete search history.

(56) References Cited

U.S. PATENT DOCUMENTS

2003/0236656 A1* 12/2003 Dougherty ...................... 703/14
2009/0027007 A1* 1/2009 Iwane et al. .................. 320/129
2009/0306915 A1 12/2009 Schoch
2009/0321163 A1* 12/2009 Suzui ....................... 180/65.265
2010/0036626 A1* 2/2010 Kang et al. ..................... 702/63
2010/0174499 A1* 7/2010 Kang et al. ..................... 702/63

FOREIGN PATENT DOCUMENTS

| JP | 2006-292565 A | 10/2006 |
| JP | 2007-57385 A | 3/2007 |
| JP | 2007-187534 A | 7/2007 |
| JP | 2010-500539 A | 1/2010 |

* cited by examiner

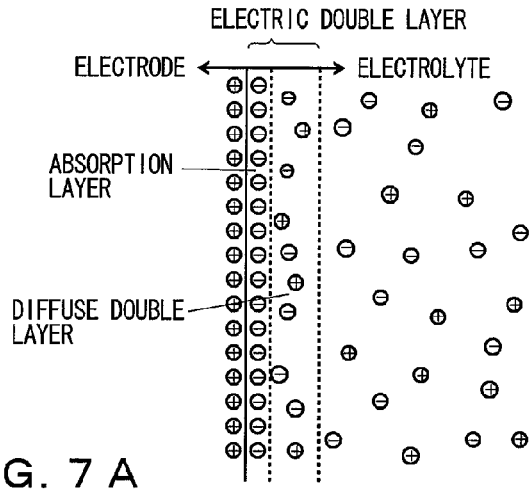
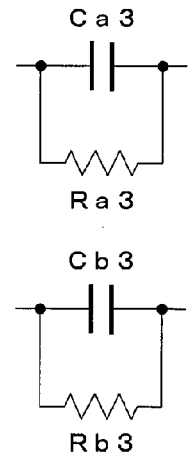
F I G. 7 A
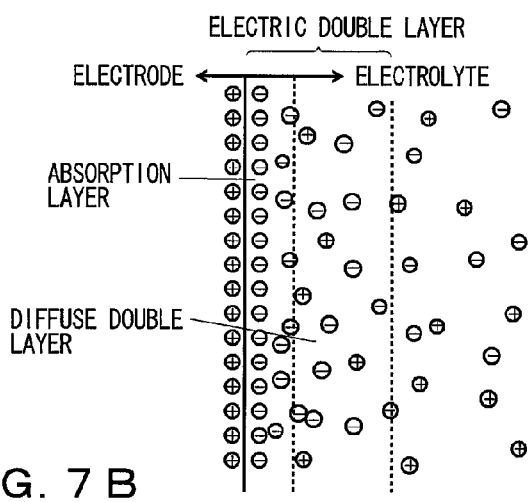
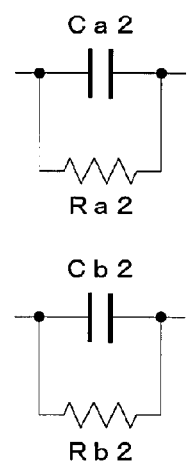
F I G. 7 B
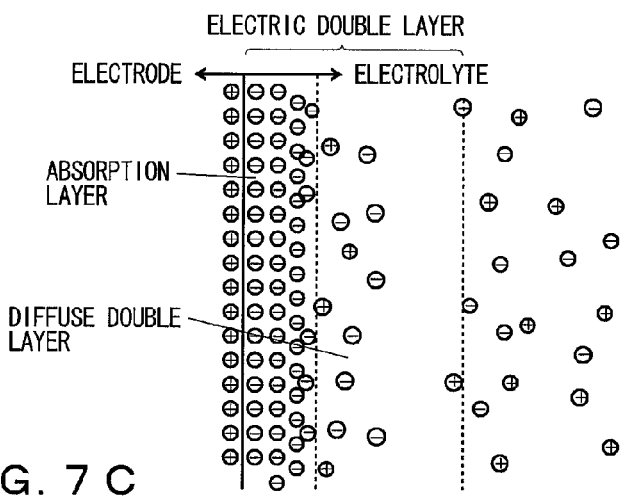
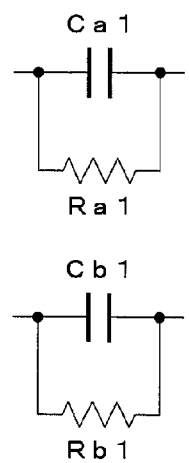
F I G. 7 C

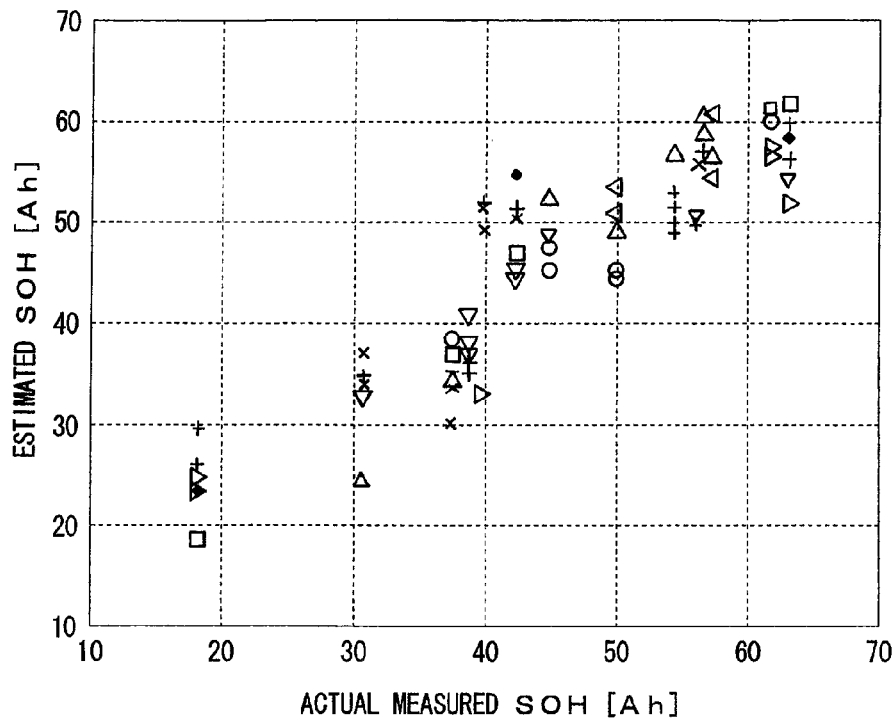
F I G. 1 0
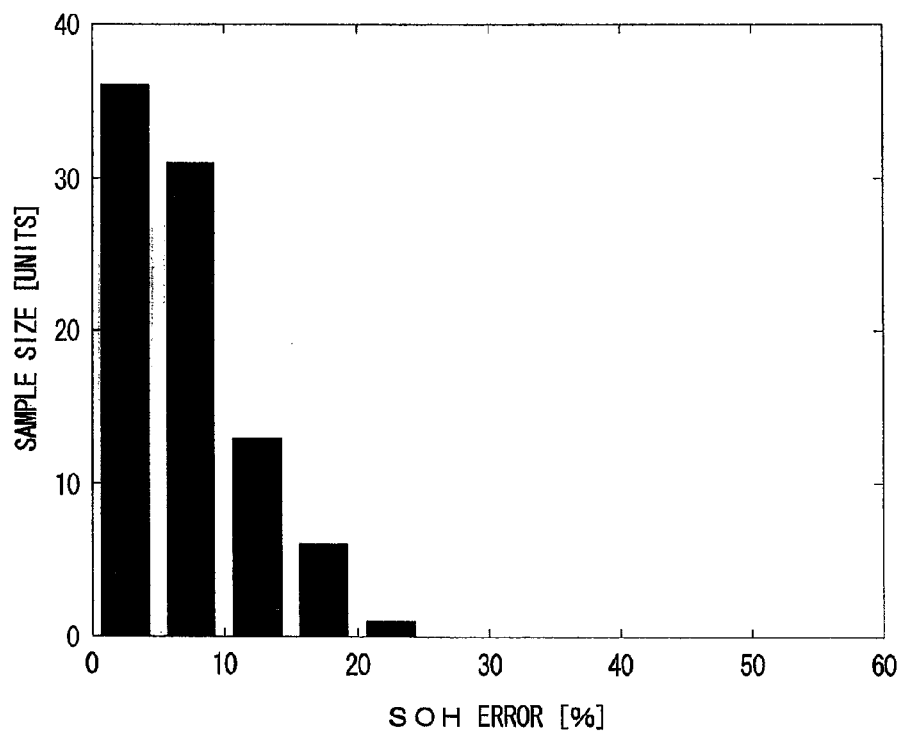
F I G. 1 1

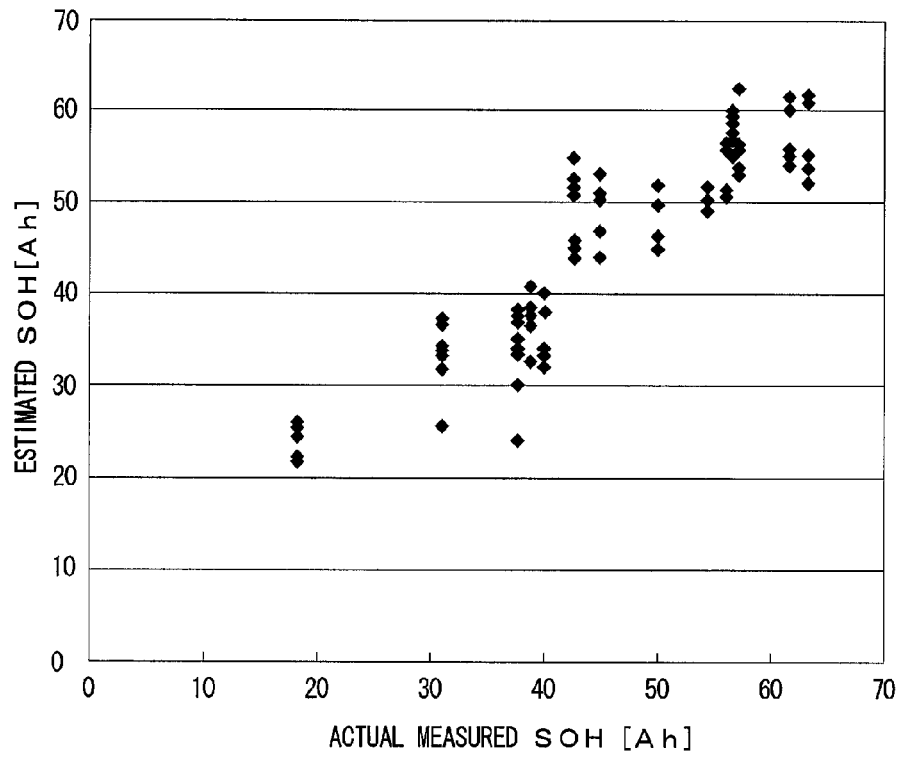
F I G. 17
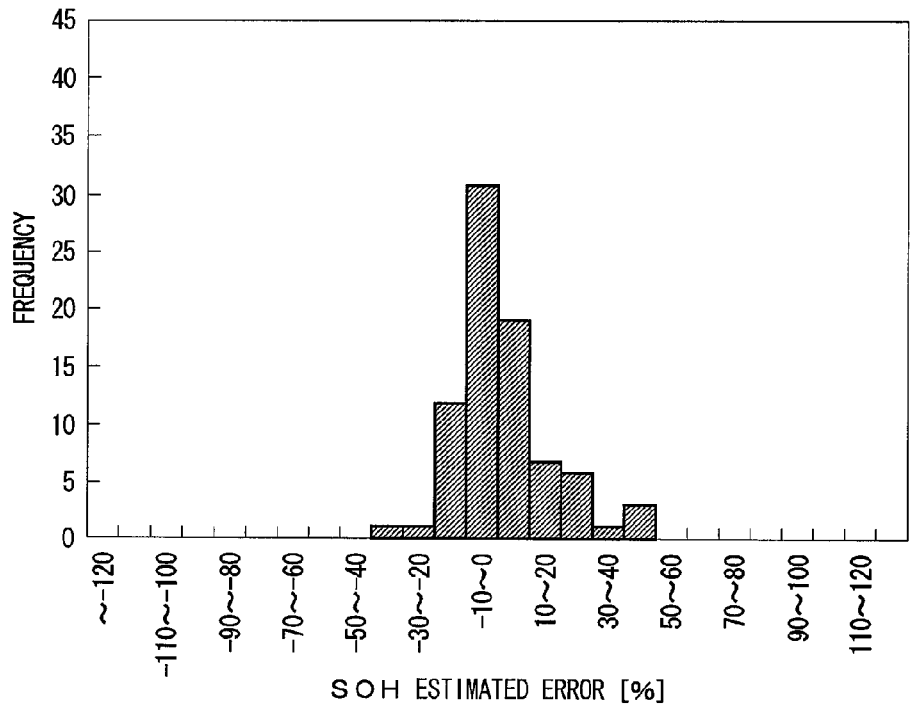
F I G. 18

|  | ESTIMATED ERROR [Ah] | RELATIVE ESTIMATED ERROR [%] |
|---|---|---|
| MAXIMUM ERROR | 12.1 | 41.6 |
| MINIMUM ERROR | −12.9 | −34.2 |
| AVERAGE ERROR | −0.3 | 1.5 |
| STANDARD DEVIATION | 5.0 | 14.3 |
| SAMPLE SIZE | 81 | 81 |
F I G. 1 9 A
| CORRECTED SQUARE R VALUE |
|---|
| 0.8063 |
F I G. 1 9 B
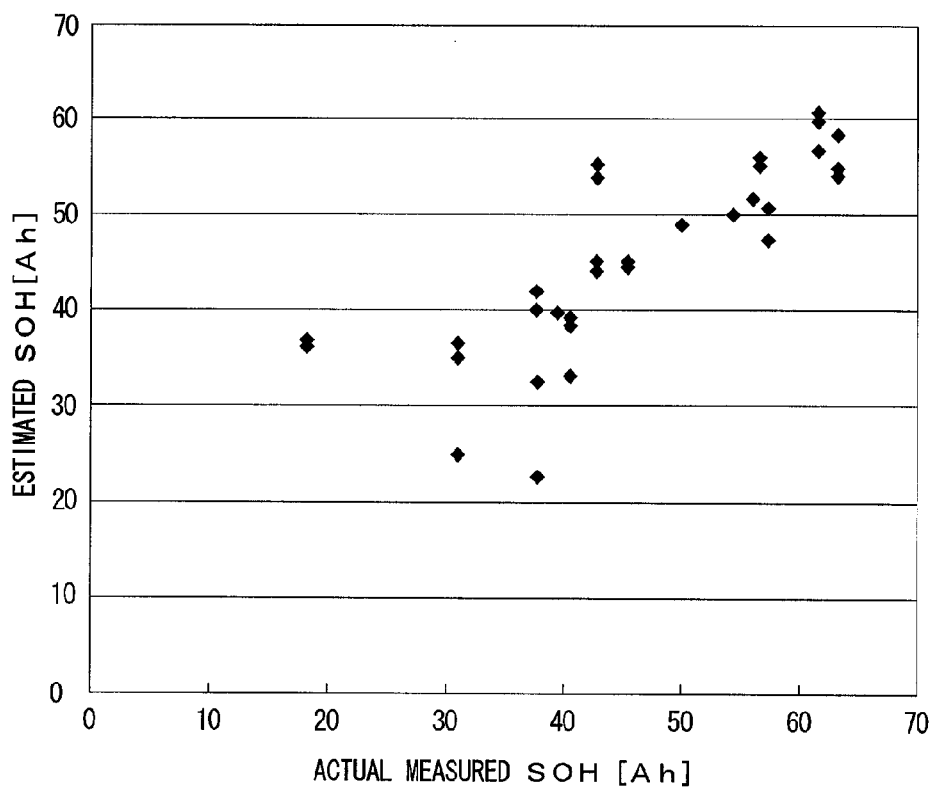
F I G. 2 0

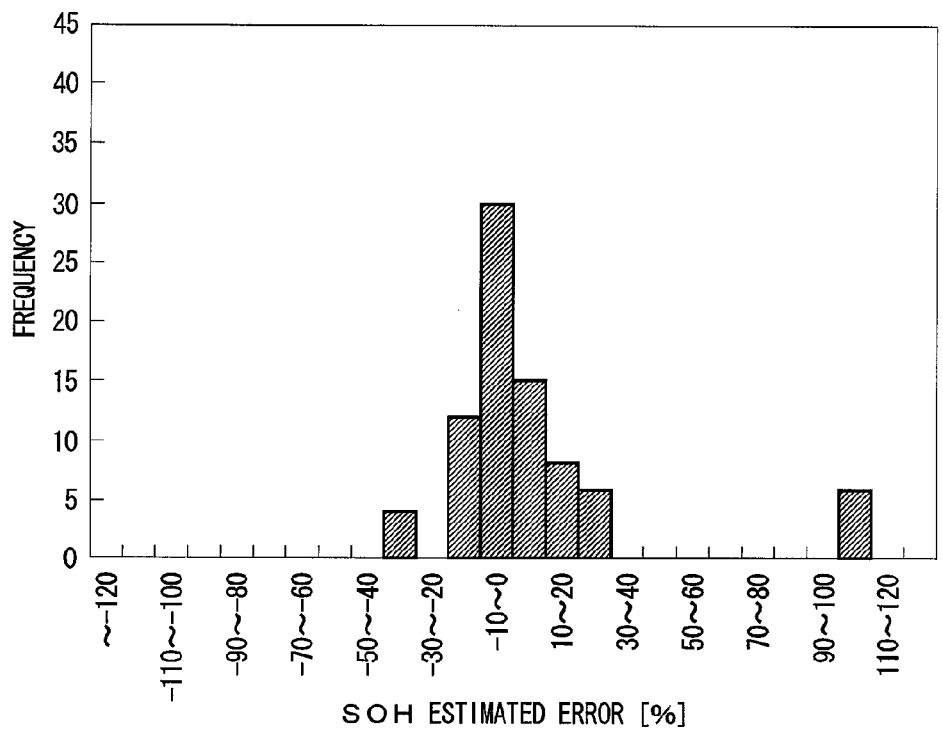
F I G. 2 1
| | ESTIMATED ERROR [Ah] | RELATIVE ESTIMATED ERROR [%] |
|---|---|---|
| MAXIMUM ERROR | 19.1 | 103.7 |
| MINIMUM ERROR | −14.8 | −39.4 |
| AVERAGE ERROR | 0.2 | 5.9 |
| STANDARD DEVIATION | 7.8 | 30.6 |
| SAMPLE SIZE | 81 | 81 |
F I G. 2 2 A
| CORRECTED SQUARE R VALUE |
|---|
| 0.59972 |
F I G. 2 2 B

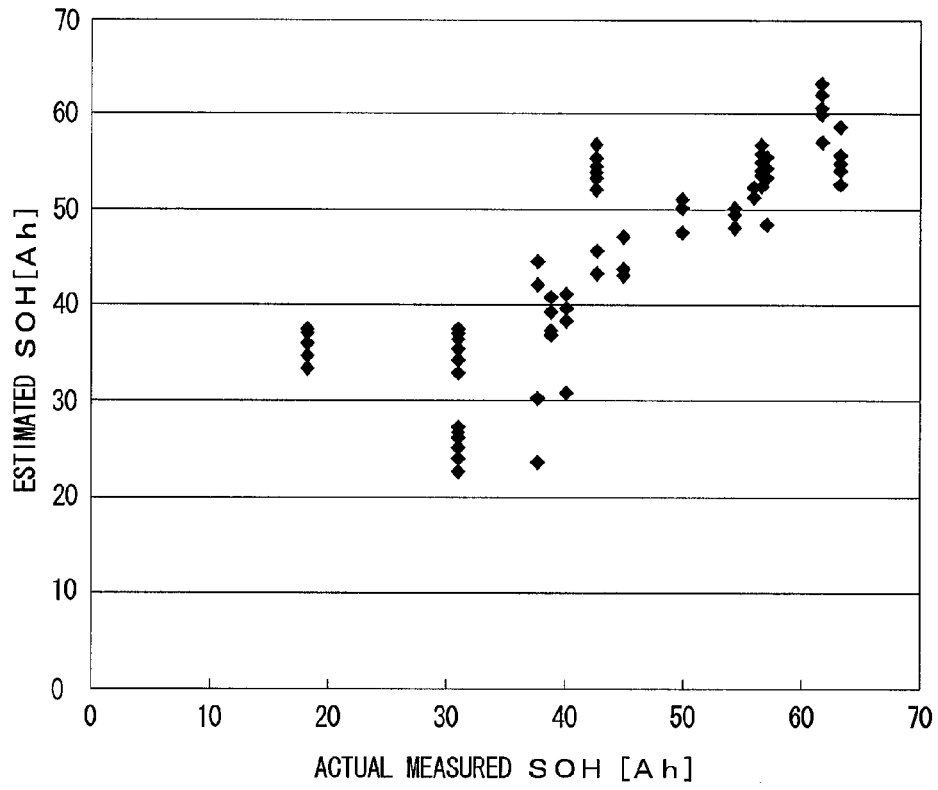
F I G. 2 3
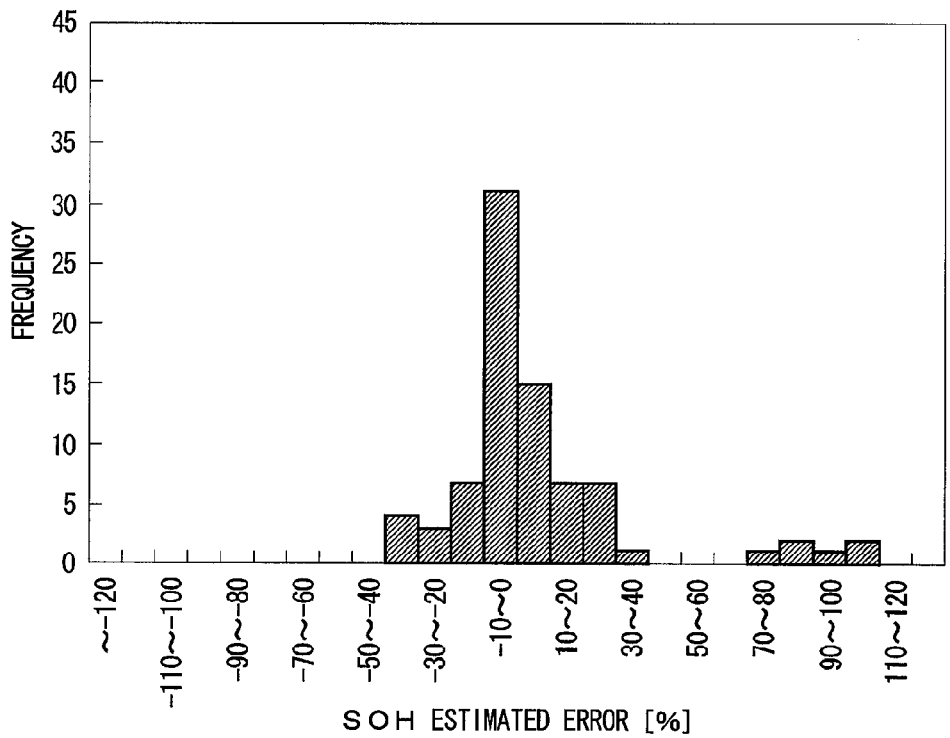
F I G. 2 4

|  | ESTIMATED ERROR [Ah] | RELATIVE ESTIMATED ERROR [%] |
|---|---|---|
| MAXIMUM ERROR | 19.3 | 105.1 |
| MINIMUM ERROR | -14.0 | -37.1 |
| AVERAGE ERROR | 0.2 | 5.5 |
| STANDARD DEVIATION | 7.7 | 28.7 |
| SAMPLE SIZE | 81 | 81 |
F I G. 25A
| CORRECTED SQUARE R VALUE |
|---|
| 0.61318 |
F I G. 25B
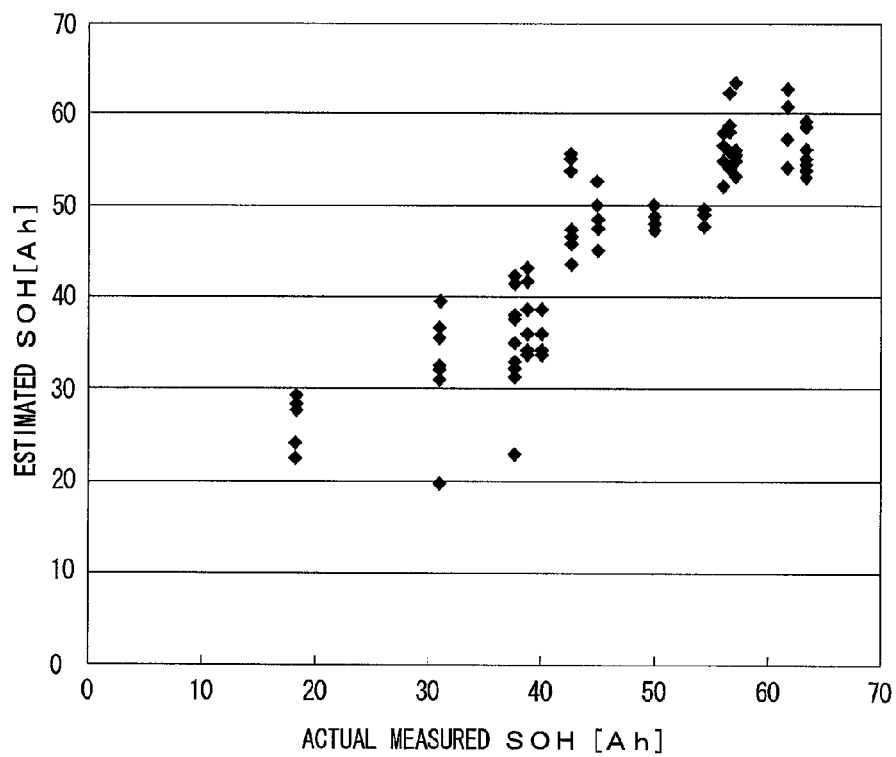
F I G. 26

| | ESTIMATED ERROR [Ah] | RELATIVE ESTIMATED ERROR [%] |
|---|---|---|
| MAXIMUM ERROR | 12.9 | 58.6 |
| MINIMUM ERROR | -14.4 | -38.4 |
| AVERAGE ERROR | -0.2 | 2.1 |
| STANDARD DEVIATION | 5.7 | 17.0 |
| SAMPLE SIZE | 81 | 81 |

| CORRECTED SQUARE R VALUE |
|---|
| 0.77955 |

|  | ESTIMATED ERROR [A h] | RELATIVE ESTIMATED ERROR [%] |
|---|---|---|
| MAXIMUM ERROR | 12.6 | 51.5 |
| MINIMUM ERROR | −15.6 | −41.6 |
| AVERAGE ERROR | −0.2 | 2.0 |
| STANDARD DEVIATION | 5.6 | 16.4 |
| SAMPLE SIZE | 81 | 81 |

F I G. 31A

| CORRECTED SQUARE R VALUE |
|---|
| 0.78603 |

F I G. 31B

BATTERY INTERNAL STATE ESTIMATING APPARATUS AND BATTERY INTERNAL STATE ESTIMATING METHOD

BACKGROUND

Technical Field

The present invention relates to a battery internal state estimating apparatus and a battery internal state estimating method.

Background Art

A method of estimating an internal state of a battery such as, for example, a technique disclosed in Japanese Laid-Open Patent Application No. 2007-187534 is known. More specifically, Japanese Laid-Open Patent Application No. 2007-187534 discloses a technique in which a Kalman filter is used in estimating an SOC (State of Charge) indicating a state of charge of a battery.

Japanese Laid-Open Patent Application No. 2007-78661 discloses a technique in which an SOH (State of Health) of a lead-acid battery is estimated based on impedance. Further, Japanese Laid-Open Patent Application No. 2007-518973 discloses a method in which a neural network is used in estimating an SOC (State of Charge) of the lead-acid battery.

SUMMARY

The technique disclosed in Patent Document 1 has a drawback that a learning efficiency is low, since parameters are adaptively learned in parallel.

With the technique disclosed in Japanese Laid-Open Patent Application No. 2007-78661, since the SOH is estimated solely based on impedance, there is a drawback that an error is large. With the technique disclosed in Patent Document 3, since no specific equation for estimating the SOH is disclosed, there is a drawback that the SOH cannot be estimated using such a technique.

In order to solve the aforementioned problem, according to an aspect of the invention, a battery internal state estimating apparatus that estimates an internal state of a battery based on a simulation model of the battery, includes a storing section that stores a plurality of parameters of the simulation model, a detecting section that detects a discharge current flowing from the battery to a load, a selecting section that selects a parameter to be subjected to adaptive learning based on a value of the discharge current detected by the detecting section, and an adaptive learning section that performs adapting learning on a parameter selected by the selecting section. With such a configuration, adaptive learning can be performed efficiently.

According to another aspect, in addition to the aforementioned aspect, the load includes at least an electric motor for starting up an engine, the detecting section detects an electric current at a start-up of the engine by the electric motor, the selecting section selects a parameter corresponding to a value of electric current flowing through the electric motor, and the adaptive learning section performs adaptive learning on a parameter selected by the selecting section. With such a configuration, a parameter can be selected based on the current flowing through the electric motor.

According to yet another aspect, in addition to the aforementioned aspect, the simulation model has, as its constituent element, at least a constant phase element (CPE) which is an equivalent circuit of a cathode and an anode of the battery, the constant phase element being represented by an equivalent circuit in which a plurality of RC parallel units are connected in series, each RC parallel unit including a resistance and a capacitor connected in parallel, an element value of each of the resistance and the capacitor constituting each RC parallel unit being taken as the parameter. The selecting section selects a predetermined RC parallel unit that has been determined in advance in accordance with the value of the discharge current, and the adaptive learning selection performs adaptive learning of the element value of each of the resistance and the capacitor which is selected by the selecting section. With such a configuration, parameters of the constant phase element constituting the simulation model can be learned efficiently.

According to still another aspect, in addition to the aforementioned aspect, the simulation model has, as its constituent element, an internal resistance of the battery, a resistance value of the internal resistance being taken as the parameter. The selecting section selects the internal resistance when a peak current which flows at the start-up of the electric motor is detected. With such a configuration, an internal resistance having a small element value can be learned efficiently.

According to still another aspect, in addition to the aforementioned aspect, the simulation model has, as its constituent element, a voltage source, a concentration value of an electrolyte inside the battery being taken as a parameter related to a voltage of the voltage source. In a case where the discharge current is zero or near zero, the selecting section selects a concentration of the electrolyte as an object to be adaptively learned. With such a configuration, a concentration of the electrolyte at a stable state can be learned efficiently.

According to still another aspect, in addition to the aforementioned aspect, the parameter constitutes a state vector of an extended Kalman filter, and the adaptive learning selection performs the adaptive learning on the state vector. With such a configuration, using an extended Kalman filter, the parameter constituting the simulation model can be learned efficiently.

According to a battery internal state estimating apparatus of an aspect of the invention, in a battery internal state estimating method of estimating an internal state of a battery based on a simulation model of the battery, the method includes a storing step of storing a plurality of parameters of the simulation model, a detecting step of detecting a discharge current flowing from the battery to a load, a selecting step of selecting a parameter to be subjected to adaptive learning based on the magnitude of the discharge current detected in the detecting step, and an adaptive learning step of carrying out adapting learning on a parameter selected in the selecting step. With such a method, adaptive learning can be performed efficiently.

According to the battery internal state estimating apparatus of an aspect of the invention, the battery internal state estimating apparatus for estimating an internal state of a battery based on a simulation model of the battery includes, a storing section that stores a plurality of parameters of the simulation model, a measuring section that measures a terminal voltage and a discharge current of the battery at a predetermined cycle, an adaptive learning section that performs adaptive learning on the parameters based on a measurement result of the measuring section, an actual measurement section that performs actual measurement of an internal resistance of the battery, and an estimating section that estimates an SOH (State of Health) indicating a degradation state of the battery based on an actual measured value $R_{meas}$ of the internal resistance obtained by the actual measurement section, as well as, a value of the parameter obtained by the adaptive learning selection and/or a corrected value of the parameter. With such a configuration, the SOH can be calculated based on a simulation model of a battery.

According to yet another aspect, in addition to the aforementioned aspect, the estimating section estimates a degradation state based on the value of the parameter and the value of the parameter is a value of the parameter η indicating an aging of the internal resistance of the simulation model. With such a configuration, the SOH can be obtained with an increased accuracy as compared to a case where only the value of the measured internal resistance is used.

According to yet another aspect, in addition to the aforementioned aspect, the estimating section estimates the degradation state based on the corrected value of the parameter and the corrected value of the parameter is a value obtained by multiplying a parameter R0 indicating an internal resistance of the simulation model by a parameter η indicating an aging of the internal resistance, and correcting the obtained value based on an average current $I_{avrg}$ flowing through the load and a stable open circuit voltage. With such a configuration, the SOH can be obtained with a further increased accuracy as compared to a case where only the parameter η is used.

According to yet another aspect, in addition to the aforementioned aspect, the estimating section estimates the degradation state based on the correction value of the parameter and the correction value of the parameter is a value obtained by multiplying parameter R0 indicating an internal resistance of the simulation model by a parameter η indicating an aging of the internal resistance, correcting the obtained value based on an average current $I_{avrg}$ flowing through the load and a stable open circuit voltage, and further correcting the corrected value based on an SOC (State of Charge) indicating a state of charge of the battery, an average voltage $V_{avrg}$ of the battery while the current is flowing through the load, and a voltage $V_{start}$ of the battery at a state before the current flows through the load. With such a configuration, the SOH can be obtained with a further increased accuracy as compared to a case where correction is performed by an average current $I_{avrg}$ and a stable open circuit voltage.

According to yet another aspect, in addition to the aforementioned aspect, the estimating section estimates a degradation state of the battery based on a value obtained by multiplying the actual measured value of the internal resistance $R_{meas}$, the parameter, and the corrected value of the parameter by predetermined constants, respectively, and summing the obtained results. With such a configuration, the SOH can be accurately estimated for any type of battery by adjusting the values of the constants.

According to an aspect of the invention, a battery internal state estimating method of estimating an internal state of the battery based on a simulation model of the battery includes a storing step of storing a plurality of parameters in the simulation model into a memory, a measuring step of measuring a terminal voltage and a discharge current of the battery at a predetermined cycle, an adaptive learning step of performing adaptive learning on the parameters based on a measurement result of the measuring step, an actual measurement step of performing actual measurement of an internal resistance of the battery, and an estimating step of estimating an SOH (State of Health) indicating a degradation state of the battery based on an actual measurement $R_{meas}$ of the internal resistance obtained by the actual measuring step as well as a value of the parameters and/or a corrected value of the parameters obtained in the adaptive learning step. With such a method, the SOH can be calculated based on a simulation model of the battery.

According to an aspect of the invention, a battery internal state estimating apparatus and a battery internal state estimating method capable of efficiently performing an adaptive learning process can be provided, and also a battery internal state estimating apparatus and a battery internal state estimating method capable of calculating the SOH based on a simulation model of a battery can be provided.

BRIEF DESCRIPTION OF THE DRAWINGS

FIGS. 7A to 7C are diagrams each illustrating a relationship between the CPE and an electric double layer shown in FIG. 6.

FIG. 10 is a plot illustrating a relationship between an SOH estimated in the first embodiment and an actual measured value.

FIG. 11 is a graph illustrating a relationship between an SOH estimated in the first embodiment and an error.

FIG. 17 is a diagram illustrating a distribution of an estimated SOH and an actual measured SOH of the second embodiment.

FIG. 18 is a diagram illustrating a relationship between an SOH estimation error and a frequency of the second embodiment.

FIG. 19A illustrates a relationship between the estimation error and a relative estimation error of the second embodiment and FIG. 19B illustrates a corrected square R value.

FIG. 20 is a diagram illustrating a distribution of an estimated SOH and a measured SOH according to the related art.

FIG. 21 is a diagram illustrating a relationship between an SOH estimation error and a frequency according to the related art.

FIG. 22A illustrates a relationship between the estimation error and a relative estimation error of the related art and FIG. 22B illustrates a corrected square R value.

FIG. 23 is a diagram illustrating a distribution of an estimated SOH and a measured SOH according to a third embodiment.

FIG. 24 is a diagram illustrating a relationship between an SOH estimation error and a frequency according to the third embodiment.

FIG. 25A illustrates a relationship between the estimation error and a relative estimation error of the third embodiment and FIG. 25B illustrates a corrected square R value.

FIG. 26 is a diagram illustrating a distribution of an estimated SOH and a measured SOH according to a fourth embodiment.

FIG. 31A illustrates a relationship between the estimation error and a relative estimation error of the fifth embodiment and FIG. 31B illustrates a corrected square R value.

DETAILED DESCRIPTION

Hereinafter, embodiments of the present invention will be described.

(A) Explanation of Configuration of First Embodiment

Figure 1:
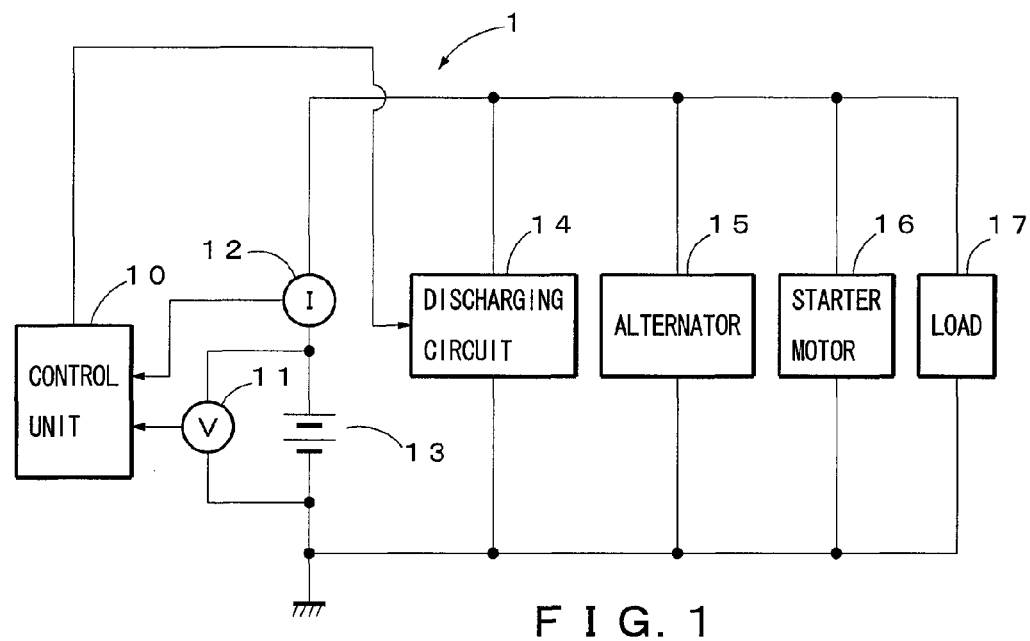
FIG. 1 is a diagram illustrating an exemplary configuration of a battery internal state estimating apparatus of a first embodiment of the present invention.

FIG. 1 is a diagram illustrating an exemplary configuration of a battery internal state estimating apparatus of a first embodiment of the present invention. As shown in FIG. 1, a battery internal state estimating apparatus 1 of the first embodiment includes, as its main constituent elements, a control unit 10, a voltage detecting unit 11 (corresponds to a part of a "detecting section" in the claims), a current detecting unit 12 (corresponds to a part of a "detecting section" in the claims) and a discharging circuit 14, and estimates an internal state of a lead-acid battery 13 (corresponds to a "battery" in the claims). In this example, an alternator 15, a starter motor 16 (corresponds to an "electric motor" in the claims) and a load 17 are connected to the lead-acid battery 13 via the current detecting unit 12. In the first embodiment, explanation will be made for a case where the battery internal state estimating apparatus 1 is, for example, installed in a vehicle such as an automobile.

Figure 2:
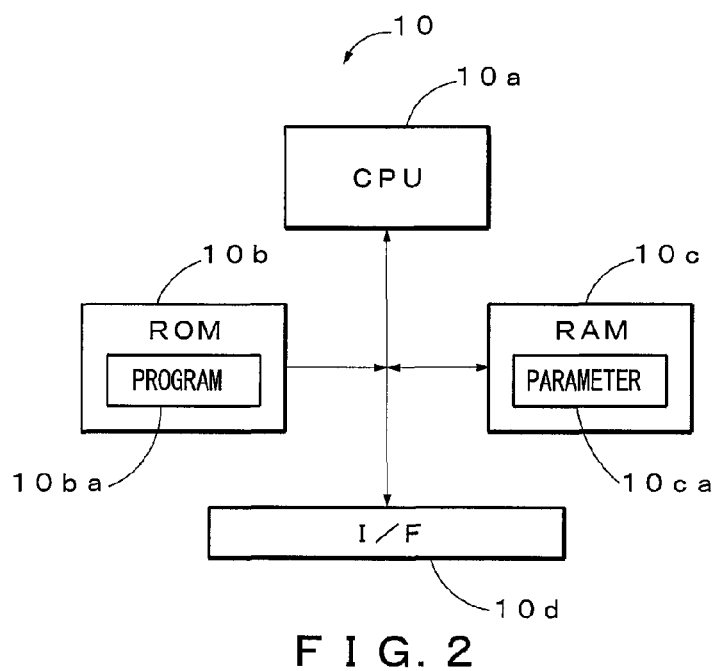
FIG. 2 is a diagram illustrating an exemplary configuration of a control unit of FIG. 1.

As shown in FIG. 2, the control unit 10 includes, as its main constituent elements, a CPU (Central Processing Unit) 10a (corresponds to a "selecting section" and an "adaptive learning section" in the claims), a ROM (Read Only Memory) 10b, a RAM (Random Access Memory) 10c (corresponds to a "storing section" in the claims) and an I/F (Interface) 10d (corresponds to a part of a "detecting section" in the claims). The CPU 10a controls each part of the apparatus in accordance with a program 10ba stored in the ROM 10b. The ROM 10b is constituted by a semiconductor memory and stores a program 10ba and other information. The RAM 10c is constituted by a semiconductor memory and stores a parameter 10ca and other information in a rewritable manner. The I/F 10d converts detection signals inputted from the voltage detecting unit 11 and the current detecting unit 12 into a digital signal, and controls the discharging circuit 14 by supplying a control signal thereto.

The voltage detecting unit 11 detects a terminal voltage of the lead-acid battery 13 and notifies the control unit 10 of the terminal voltage. The current detecting unit 12 detects an electric current flowing through the lead-acid battery 13 and notifies the control unit 10 of the electric current. The discharging circuit 14 may include a semiconductor switch, and, under control of the control unit 10, discharges an electric power accumulated in the lead-acid battery 13, for example. The alternator 15 may be driven by an engine (not shown) such as a reciprocating engine, and charge the lead-acid battery 13 by generating a direct current power, for example. The starter motor 16 may include a direct current motor, rotate by a direct current supplied from the lead-acid battery 13 and start up the engine, for example. The load 17 may include devices such as a head lamp, a wiper, a direction indicator lamp, a navigating device and other devices of an automobile, for example.

Figure 3:
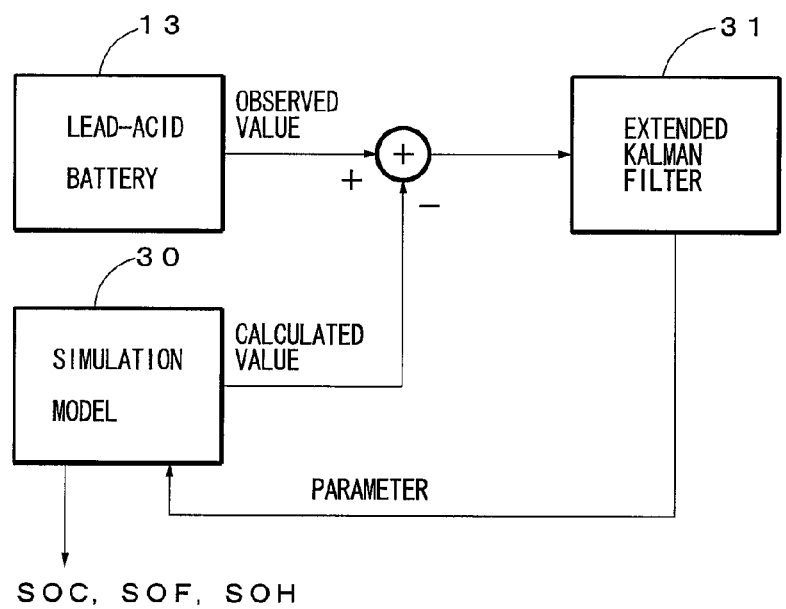
FIG. 3 is an explanatory diagram of a process algorithm executed in the first embodiment.

FIG. 3 is an explanatory diagram of an outline of a process algorithm which is achieved by executing a program 10ba. As shown in FIG. 3, in the first embodiment, a simulation model 30 for the lead-acid battery 13 is built that has a plurality of parameters. Then, an observed value is obtained by observing the target lead-acid battery 13 and a calculate value corresponding to the observed value is obtained based on the simulation model 30. By calculating deviations of these observed value and the calculated value, optimal parameters are estimated by adaptive learning based on an extended Kalman filter 31. Then, by updating the simulation model 30 with the estimated parameters, the simulation model 30 can be optimized. With the simulation model 30 optimized in such a manner, an SOC (State of Charge), an SOF (State of Function) and an SOH (State of Health) for estimating an internal state of the lead-acid battery 13 can be obtained by calculating. In the first embodiment, since the parameters to be subjected to adaptive learning are selected depending on a value of the discharge current discharged from the lead-acid battery 13, adaptive learning can be performed with an increased accuracy.

In this specification, "adaptive learning" is a method in which a flexible and general model having parameters is prepared and the parameters are statistically and adaptively optimized by learning. In each of the embodiments described below, an extended Kalman filter is used as an example of adaptive learning. However, the present invention is not limited thereto, and, for example, a neural network model based adaptive learning or a genetic algorithm based adaptive learning may also be employed. In other words, any method can be employed as long as it is a method in which a model of a target to be learned is created and a parameter(s) constituting the model is optimized with a result obtained by observation.

Figure 4:
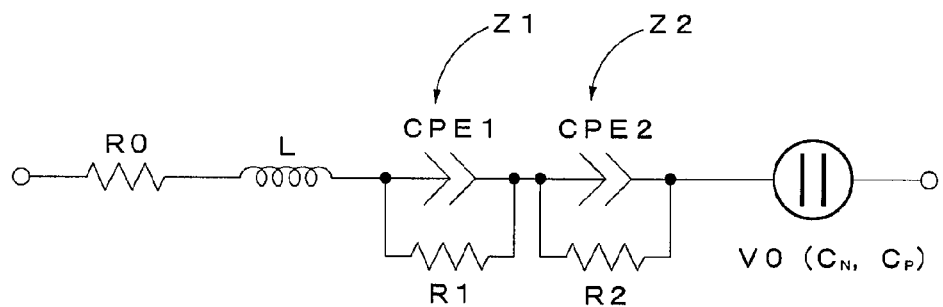
FIG. 4 is an exemplary diagram illustrating a simulation model of a lead-acid battery.

FIG. 4 is an exemplary diagram illustrating a simulation model 30 (in this example, an electric equivalent circuit) of a lead-acid battery 13. In this example, the simulation model 30 includes, as its main constituent elements, a resistance R0, an inductance L, impedances Z1, Z2 and a voltage source V0.

Here, the resistance R0 is an internal resistance including, as its main elements, a conductive resistance of electrodes of the lead-acid battery 13 and a solution resistance of the electrolyte. The inductance L is an induced component due to an electric field produced by an electric current flowing through electrodes, etc., of the lead-acid battery 13. This inductance L can be neglected if necessary, since it is a much smaller value as compared to an impedance value of a cable connected to the lead-acid battery 13. The impedance Z1 is an equivalent circuit corresponding to a cathode of the lead-acid battery 13 and the electrolyte in contact with the cathode, basically has a characteristic in accordance with Butler-Volmer's equation, and can be expressed as a parallel-connected circuit of a constant phase element CPE1 and a resistance R1. Details of the impedance Z1 will be described later. The impedance Z2 is an equivalent circuit corresponding to an anode of the lead-acid battery 13 and the electrolyte in contact with the anode, has a characteristic based on the aforementioned Butler-Volmer's equation and can be expressed as a parallel-connected circuit of a constant phase element CPE2 and a resistance R2. Details of the impedance Z2 will also be described later. The voltage source V0 is an ideal voltage source having an internal impedance of 0, and its voltage is expressed by parameters including an electrolyte concentration $C_N$ in the vicinity of the anode and an electrolyte concentration $C_P$ in the vicinity of the cathode.

Figure 5:
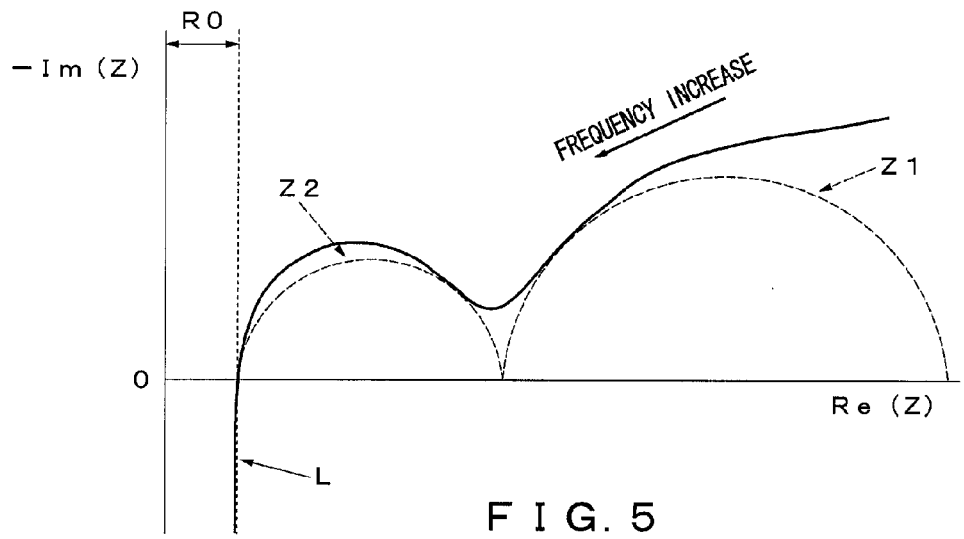
FIG. 5 is a diagram illustrating an impedance characteristic of a simulation model shown in FIG. 4.

FIG. 5 is a diagram illustrating an impedance characteristic of the equivalent circuit shown in FIG. 4. In FIG. 5, the vertical axis represents an imaginary component (Im(Z)) of the impedance and the horizontal axis represents a real component (Re(Z)) of the impedance. A thick line in the graph represents an impedance characteristic of the equivalent circuit. In this example, as the frequency increases, the impedance of the equivalent circuit moves from right to left on the thick line, i.e., firstly it follows a trajectory in such a manner that it approaches asymptotically to a semicircle represented by Z1 and then it follows a trajectory in such a manner that it approaches asymptotically to a semicircle represented by Z2. Further, it has a characteristic in which, at a higher frequency, the real component approaches asymptotically to a straight line R0, and, due to the inductance L, the impedance increases with an increase in the frequency.

Figure 6:
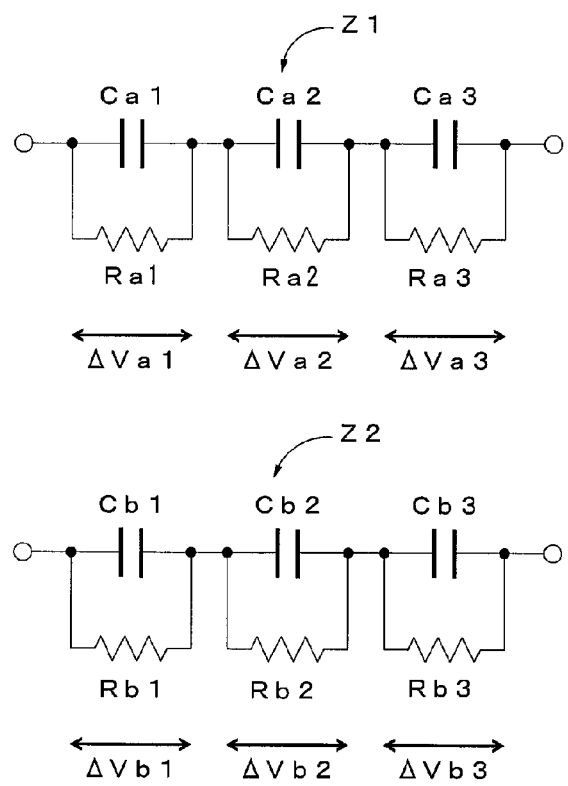
FIG. 6 is a diagram illustrating an equivalent circuit of a CPE shown in FIG. 4.

FIG. 6 is a diagram illustrating equivalent circuits of the impedances Z1, Z2 used in the first embodiment. In this example, the impedance Z1 includes a plurality of RC parallel units connected in series, each RC parallel unit including resistances Ra1, Ra2, Ra3 and capacitors Ca1, Ca2, Ca3 connected in parallel, respectively. Specifically, the resistance Ra1 and the capacitor Ca1 are connected in parallel to constitute a single RC parallel unit, and similarly, the resistance Ra2 and the capacitor Ca2 are connected in parallel and the resistance Ra3 and the capacitor Ca3 are connected in parallel to constitute the respective RC parallel units. As shown in FIG. 6, a voltage drop across each of the RC parallel units is represented by ΔVa1, ΔVa2 and ΔVa3.

The impedance Z2 includes a plurality of RC parallel units connected in series, each RC parallel unit including resistances Rb1, Rb2, Rb3 and capacitors Cb1, Cb2, Cb3 connected in parallel, respectively. Also, as shown in FIG. 6, a voltage drop across each of the RC parallel units is represented by ΔVb1, ΔVb2 and ΔVb3.

FIGS. 7A to 7C are diagrams illustrating a relationship between the discharge current of the lead-acid battery 13 and an electric double layer produced between the electrode and the electrolyte. FIG. 7A illustrates a state of the electric double layer in a case where the discharge current is small. FIG. 7B illustrates a state of the electric double layer in a case where the discharge current is greater than the case shown in FIG. 7A. FIG. 7C illustrates a state of the electric double layer in a case where the discharge current is greater than the case shown in FIG. 7B. As can be seen FIGS. 7A to 7C, the electric double layer tends to extend in response to an increase in the current. In the first embodiment, the state shown in FIG. 7A is represented by the RC parallel unit including the resistance Ra3 and the capacitor Ca3 and the RC parallel unit including the resistance Rb3 and the capacitor Cb3. Also, the state shown in FIG. 7B is represented by the RC parallel unit including the resistance Ra2 and the capacitor Ca2 and the RC parallel unit including the resistance Rb2 and the capacitor Cb2. Further, the state shown in FIG. 7C is represented by the RC parallel unit including the resistance Ra1 and the capacitor Ca1 and the RC parallel unit including the resistance Rb1 and the capacitor Cb1.

(B) Explanation of Overall Operation of the First Embodiment

Figure 8:
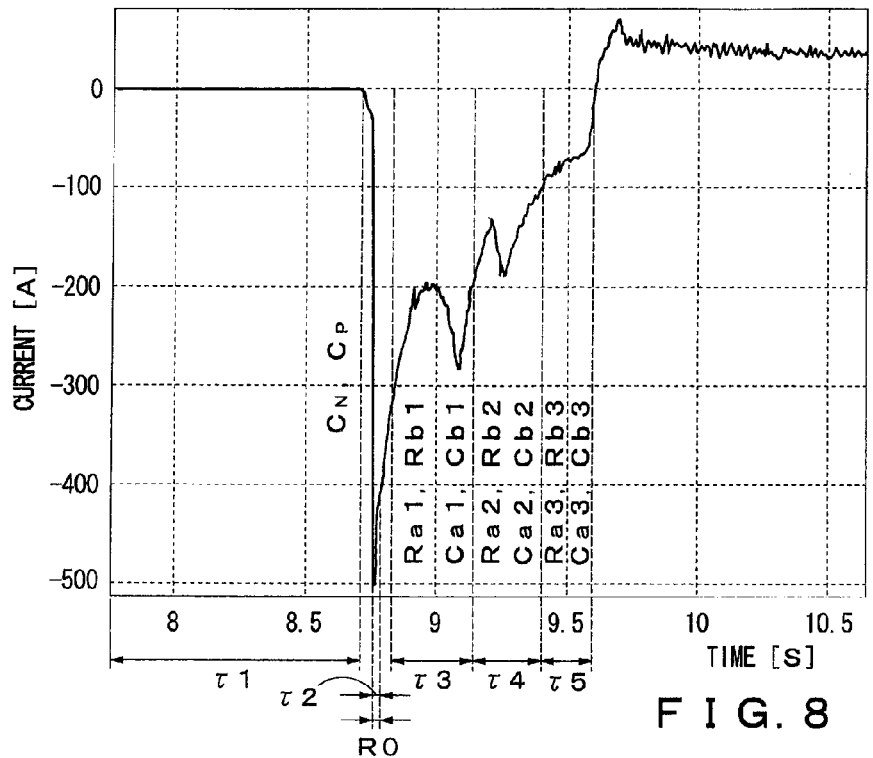
FIG. 8 is a plot of a relationship between a discharge current and parameters to be subjected to adaptive learning in the first embodiment.
Figure 9:
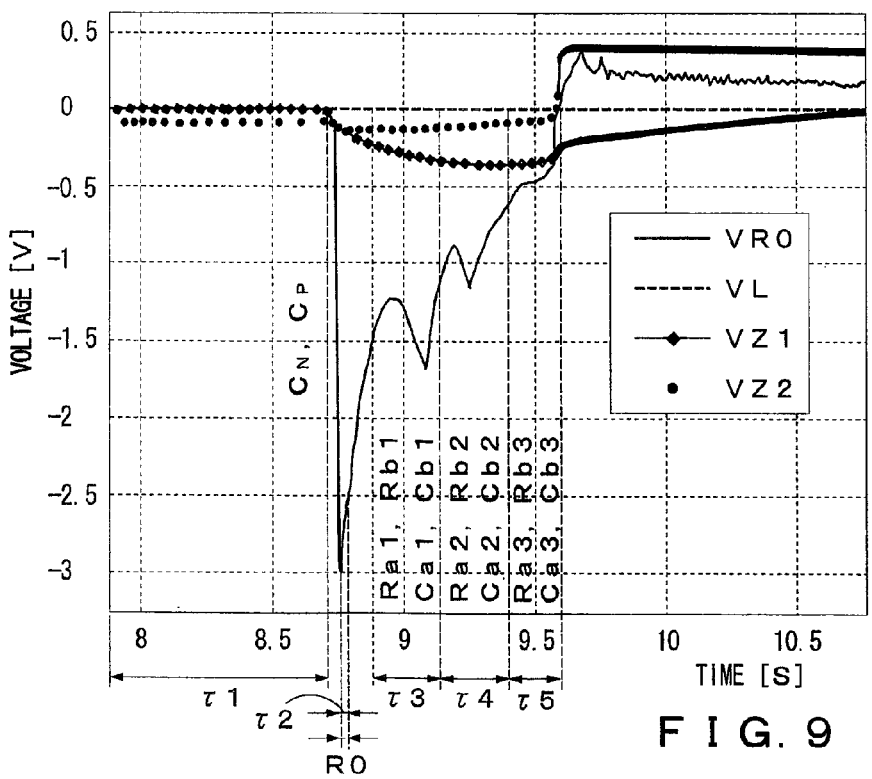
FIG. 9 is a plot of a voltage drop for each constituent element of the simulation model in the first embodiment.

Hereinafter, an overall operation of the embodiment will be described. In the first embodiment, when starting up the engine by the starter motor 16, parameters of the simulation model 30 are selected based on a value of the discharge current flowing from the lead-acid battery 13 to the starter motor 16. Adaptive learning is performed on the selected parameters, whereas adaptive learning is not performed on parameters other than the selected parameters. FIG. 8 is a plot of the discharge current flowing from the lead-acid battery 13 with respect to time for a case where the engine is started up by the starter motor 16. FIG. 9 is a plot of a voltage drop across the resistance R0 (VR0), a voltage drop across the inductance L (VL), a voltage drop across the impedance Z1 (VZ1) and a voltage drop across the impedance Z2 (VZ2), for the same case as the case shown in FIG. 8. In this example, the discharge current is almost not flowing during a period before rotation of the starter motor 16 (period τ1), and, in this period, adaptive learning is performed on the parameters $C_N$ and $C_P$ representing the electrolyte concentrations. During a period prior to the rotation of the starter motor 16, since the concentration distribution of electrolyte in the lead-acid battery 13 is stable, an accurate concentration value can be learned by selecting and performing adaptive learning on the parameters during such a period.

When the starter motor 16 starts rotating, the discharge current rapidly starts to flow (i.e., an inrush current flows). Since the starter motor 16 is a brushed direct current motor, the inrush current will be at its largest when starting up from a stopped condition. Also, the magnitude of the inrush current may vary depending on, for example, an environmental temperature and a state of the engine. Specifically, the viscosity of the lubricant is increased in a state where the engine has been cooled due to a stoppage for a long period of time or due to a low temperature, a driving torque will be large and the current will also be large correspondingly. In this example, in a period (period τ2) exceeding a predetermined threshold which is set near 500 A, which is a peak current (in this example, 400 A), the resistance R0 is selected and adaptive learning is performed thereon. It is to be noted that the reason for carrying out adaptive learning of the value of the resistance R0 in the period in which an electric current close to the maximum current is flowing is that, since the value of the resistance R0 is very small, a voltage drop due to this can most easily be observed in the period in which a current near the maximum current is flowing.

Next, in a first period where the current flowing through the starter motor 16 has decreased below the peak current (period τ3), Ra1, Ca1, Rb1 and Cb1 are selected as parameters to be learned in adaptive learning. This period corresponds to a state shown in FIG. 7C, and this state is associated with the RC parallel unit including Ra1 and Ca1 and the RC parallel unit including Rb1 and Cb1. Accordingly, in the period where the discharge current is between 300 A and 200 A, Ra1, Ca1, Rb1 and Cb1 are selected and adaptive learning is performed.

Next, in a period in where the discharge current is between 200 A and 100 A, Ra2, Ca2, Rb2 and Cb2 are selected as parameters to be learned in adaptive learning. This period corresponds to the state shown in FIG. 7B and this state is associated with the RC parallel unit including Ra2 and Ca2 and the RC parallel unit including Rb2 and Cb2. Accordingly, in the period where the discharge current is between 200 A and 100 A, Ra2, Ca2, Rb2 and Cb2 are selected and adaptive learning is performed.

Next, in a period where the discharge current is between 100 A and 0 A, Ra3, Ca3, Rb3 and Cb3 are selected as parameters to be learned in adaptive learning. This period corresponds to the state shown in FIG. 7A and this state is associated with the RC parallel unit including Ra3 and Ca3 and the RC parallel unit including Rb3 and Cb3. Accordingly, in the period where the discharge current is between 100 A and 0 A, Ra3, Ca3, Rb3 and Cb3 are selected and adaptive learning is performed. It is to be noted that when the engine is started up by the starter motor 16, the alternator 15 starts charging and the current flowing through the lead-acid battery 13 becomes positive (see FIG. 8).

A method of adaptive learning may, for example, include obtaining detection values of the voltage detecting unit 11 and the current detecting unit 12 for each predetermined period (10 mS) and producing observed values based on the detection values, and on the other hand, generating predicted values based on the simulation model 30. Then, it can be achieved by comparing the observed values with the predicted values and optimizing the parameters selected in accordance with the comparison result using the extended Kalman filter. Since there are various methods as described above for the optimal learning method, an optimal method may be selected from the plurality of methods.

By using the simulation model 30 on which adaptive learning has been performed as described above, for example, the SOC, the SOF and the SOH can be calculated accurately. By referring to these values, it is possible to know an internal state of the lead-acid battery 13 accurately.

A specific example will be described. FIG. 10 is a plot of a relationship between an SOH which is calculated (estimated) using the simulation model 30 of the first embodiment and an actual measured value of the SOH. In FIG. 10, the horizontal axis represents the actual measured value, the vertical value represents the estimated value, and each point represents a sample. In FIG. 10, the points are approximately aligned on a straight line at 45 degrees along which the estimated values and the calculated value match, and thus indicate that the validity of the estimation of the first embodiment is high. FIG. 11 is a chart illustrating a relationship between an SOH error and a sample size. In this figure, the horizontal axis represents the SOH error (%) and the vertical axis represents a sample size. As can be seen in this figure, a majority of the samples are those having an error of 10% or below. From this figure, it can also be seen that the validity of the first embodiment is high.

As has been described above, in the first embodiment, the parameters to be adaptively learned are selected in accordance with the value of the discharge current, and adaptive learning is carried out. Accordingly, since adaptive learning is carried out at the timing where each of the parameters is most significantly appearing in the observed values, it is possible to know the internal state of the lead-acid battery 13 accurately by performing adaptive learning efficiently. Also, since limited parameters among the plurality of parameters are subjected to adaptive learning, time required for calculating can be reduced. Therefore, for example, it becomes possible to use a processor having a low computing power and thus a production cost of the apparatus can be reduced.

(C) Explanation of Detailed Operation of First Embodiment

Figure 12:
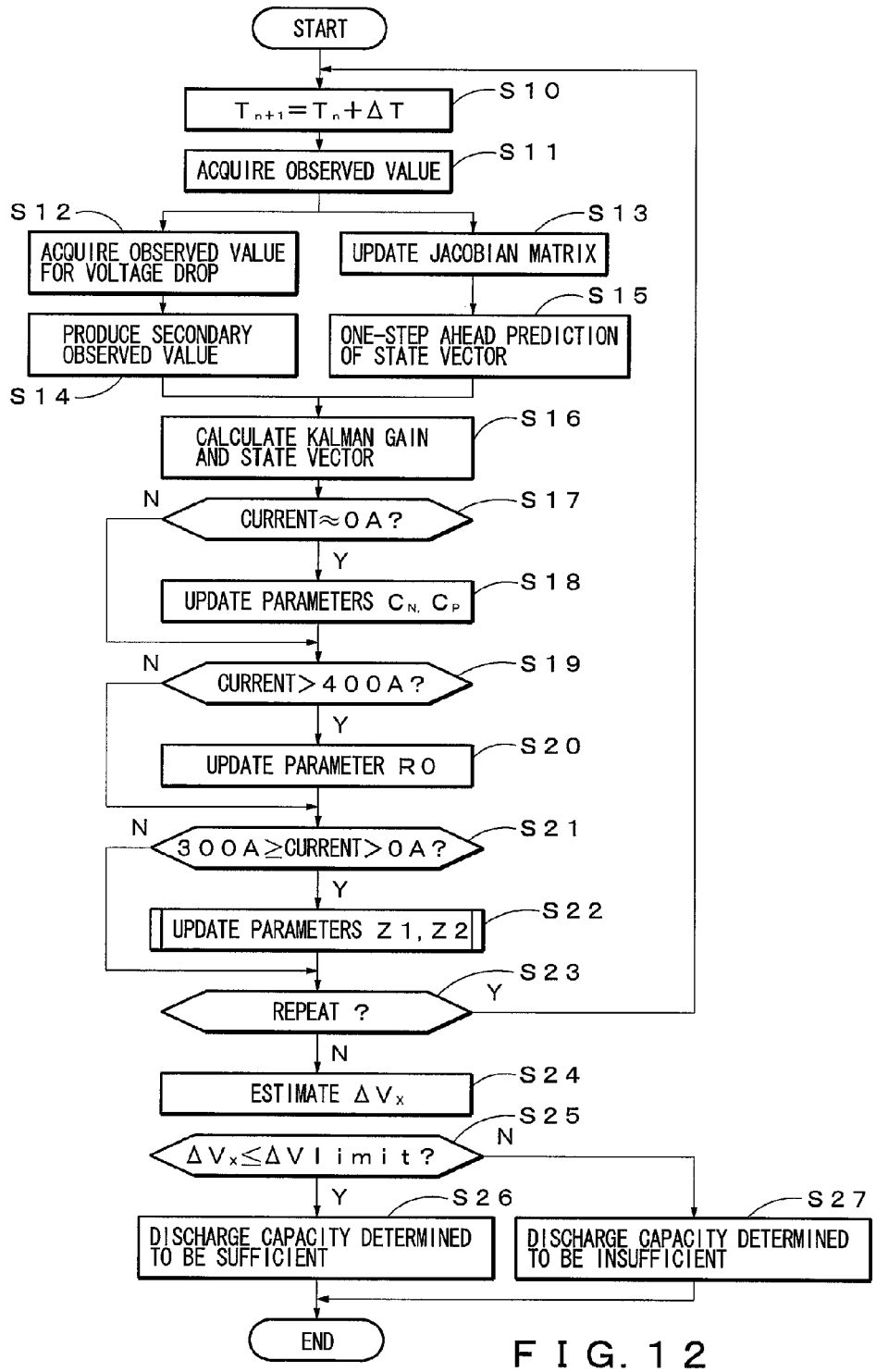
FIG. 12 is a flowchart for explaining a flow of the process executed in the battery internal state estimating apparatus shown in FIG. 1.
Figure 13:
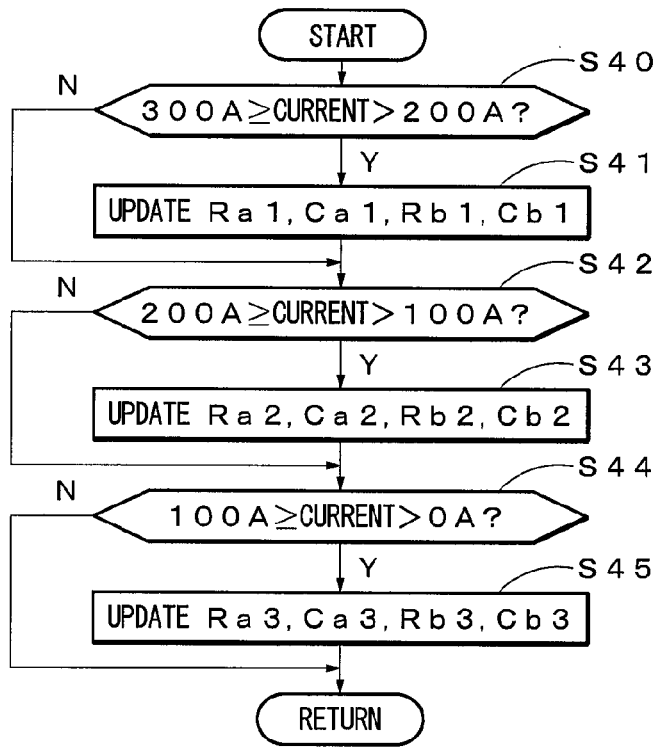
FIG. 13 is a flowchart for explaining details of a process of step S22 in FIG. 12.

Now, referring to the flowcharts illustrated in FIGS. 12 and 13, a detailed operation of the first embodiment will be described. FIG. 12 is a flowchart for explaining a process performed in the embodiment shown in FIG. 1. FIG. 13 is a flowchart for explaining details of a process of step S22 in FIG. 12. In the first embodiment, in the equivalent circuit shown in FIG. 4, the voltage drop across the resistance R0 and the impedances Z1, Z2 is defined as $\Delta V$, and a predicted value of the voltage drop $\Delta V$ is derived as $\Delta Vx$ by the simulation model 30. Then, by comparing the predicted value $\Delta Vx$ with a predetermined tolerance, the discharge capacity of the lead-acid battery 13 is determined. Here, the inductance L is neglected since impedance resulting from the wiring is greater. The following relationship is established between a voltage drop $\Delta V$, a terminal voltage of lead-acid battery 13 V and a voltage V0 of the voltage source corresponding to an OCV (Open Circuit Voltage):

$$\Delta V = V - V0 \tag{1}$$

In order to determine the discharge capacity of the lead-acid battery 13 accurately, it is necessary to accurately estimate the predicted value $\Delta Vx$ of the voltage drop for a case where the simulation model 30 (equivalent circuit) of the lead-acid battery 13 discharges the current with a predetermined pattern. In the first embodiment, at the time of start-up of the engine by the starter motor 16, the lead-acid battery 13 is observed at a discrete time with a predetermined time interval ($\Delta T$), and the parameters of the simulation model 30 are adaptively learned based on the obtained observed value, such that the voltage drop $\Delta Vx$ can be estimated accurately. When the flowchart shown in FIG. 12 is performed, the process below is carried out. This process is, for example, performed when an "ignition key" for starting up the engine is turned.

In step S10, the CPU 10a acquires current time $T_{n+1}$ by adding a time interval $\Delta T$ (e.g., 10 mS) to time $T_n$ at which the previous process was performed. Specifically, the process shown in FIG. 12 is performed at a time interval $\Delta T$, and thus the time is incremented by $\Delta T$ each time the process is performed.

In step S11, the CPU 10a acquires an observed value for the lead-acid battery 13. Specifically, the CPU 10a causes the discharging circuit 14 to be in an ON state for a period which is shorter than $\Delta T$ (e.g., a period of 10% of $\Delta T$) to let a discharge current flow. Also, the CPU 10a acquires a terminal voltage of the lead-acid battery 13 from the voltage detecting unit 11 and stores it into a variable $V_{n+1}$ and acquires the discharge current of the lead-acid battery 13 from the current detecting unit 12 and stores it into a variable $I_{n+1}$. Further, $SOC_{n+1}$ is calculated in accordance with a predetermined SOC-calculating method. A specific calculation method may include, for example, a method using a measured value of a stable OCV at an initial stage of the start-up of the lead-acid battery 13 (in detail, the terminal voltage (=V0) of the lead-acid battery 13 measured during period $\tau1$ in FIG. 8) in combination with an integrated current value and a method using a current-voltage characteristic (I/V) in an operating environment, and either of these methods may be employed. It is to be noted that, since the voltage detecting unit 11 has a very high internal resistance and the current hardly flows during the measurement, the voltage measured at the an initial stage of the start-up of the lead-acid battery 13 is hardly influenced by the resistance R0 and the impedances Z1 and Z2, and thus a voltage V0 of the voltage source can be measured.

In step S12, the CPU 10a acquires a voltage drop $\Delta V_{n+1}$ by substituting the observed value acquired in step S11 into the following equation:

$$\Delta V_{n+1} = V_{n+1} - OCV_{n+1} \quad (2)$$

Here, $OCV_{n+1}$ can be calculated from $SOC_{n+1}$ acquired in step S12 using the following equation:

$$OCV_{n+1} = a \cdot SOC_{n+1} + b \quad (3)$$

In equation (3), coefficients a and b may be values obtained in advance by an experiment or the like. Such values may be, for example, stored in the ROM 10b. Also, since there may be a case where the coefficients a and b are temperature-dependent, the coefficients a and b corresponding to a temperature obtained at a temperature detecting unit, not shown, may be retrieved from the table stored in the ROM 10b.

In step S13, the CPU 10a updates a Jacobian matrix $F_n$ using an n-th observed value and a previous state vector estimation value. Now, in the first embodiment, the Jacobian matrix $F_n$ is expressed as follows. In the equation, "diag" indicates a diagonal matrix.

$$F_n = \text{diag}(1 - \Delta T/Ra1_n \cdot Ca1_n, 1 - \Delta T/Ra2_n \cdot Ca2_n, 1 - \Delta T/Ra3_n \cdot Ca3_n, 1 - \Delta T/Rb1_n \cdot Cb1_n, 1 - \Delta T/Rb2_n \cdot Cb2_n, 1 - \Delta T/Rb3_n \cdot Cb3_n, 1, 1, 1, 1, 1, 1, 1, 1, 1, 1, 1, 1) \quad (4)$$

In step 14, the CPU 10a obtains an observation residual $Y_{n+1}$ which is $\Delta V_{n+1}$ calculated from the observed value obtained by an observation in step S12.

$$Y_{n+1} = \Delta V_{n+1} \quad (5)$$

In step 15, the CPU 10a predicts a one-step ahead state vector. Specifically, for example, a voltage drop $\Delta Va1_n$ at the RC parallel circuit on the left end in FIG. 6 is expressed as follows:

$$\Delta Va1_{n+1} = \Delta Va1_n - \Delta Va1_n \cdot \Delta T/Ra1_n \cdot Ca1_n \quad (6)$$

Therefore, a state vector $X_n^T$ is expressed by the following equation. In the equation, T indicates a transpose matrix.

$$X_n^T = (\Delta Va1_n, \Delta Va2_n, \Delta Va3_n, \Delta Vb1_n, \Delta Vb2_n, \Delta Vb3_n, R0_n, Ra1_n, Ra2_n, Ra3_n, Ca1_n, Ca2_n, Ca3_n, Rb1_n, Rb2_n, Rb3_n, Cb1_n, Cb2_n, Cb3_n) \quad (7)$$

Also, the input vector $U_n^T$ is expressed by the following equation.

$$U_n^T = (\Delta t \cdot I_n/Ca1_n, \Delta t \cdot I_n/Ca2_n, \Delta t \cdot I_n/Ca3_n, \Delta t \cdot I_n/Cb1_n, \Delta t \cdot I_n/Cb2_n, \Delta t \cdot I_n/Cb3_n, 0, 0, 0, 0, 0, 0, 0, 0, 0, 0, 0, 0, 0) \quad (8)$$

Accordingly, a one-step ahead predicted value $X_{n+1|n}$ of $X_n$ is calculated by the following equation:

$$X_{n+1|n} = F_n \cdot X_n + U_n \quad (9)$$

Further, a Jacobian $H_n^T$ = related to the observation model is expressed by the following equation.

$$H_n^T = (1, 1, 1, 1, 1, 1, I_n, 0, 0, 0, 0, 0, 0, 0, 0, 0, 0, 0, 0) \quad (10)$$

Then, a system equation and an observation equation can be expressed by the following equations:

$$\text{System Equation: } X_{n+1} = F_n \cdot X_n \quad (11)$$

$$\text{Observation Equation: } Y_{n+1} = H_n^T \cdot X_n \quad (12)$$

In step S16, the CPU 10a calculates an optimal Kalman gain using a one-step ahead predicted value $X_{x+1|n}$ and the observed value $Y_{n+1}$, and calculates an updated value of the state vector $X_{x+1|n+1}$ based on this optimal Kalman gain. It is to be noted that, according to an operation using a normal extended Kalman filter, all parameters are updated using the obtained state vector $X_{x+1|n+1}$, whereas according to the first embodiment, as will be described later, the update process is performed on predetermined parameters only, which are determined based on the value of the discharge current.

In step S17, the CPU 10a determines whether or not the electric current $I_n$ observed in step S12 satisfies $I_n \approx 0$ A, and if $I_n \approx 0$ A (step S17: YES), proceeds to step S18, and if not (step S17: NO), proceeds to step S19. For example, since $I_n \approx 0$ A is satisfied during the period shown in FIG. 8, in such a case, the process proceeds to step S18. As a specific method of determination, for example, when an electric current which is constantly flowing through the load 17 while the engine is being stopped (e.g., an electric current value of several tens of mA flowing through a car-mounted clock, a car security system, etc.) is flowing, it is considered that $I_n \approx 0$ A is satisfied, and the process proceeds to step S18.

In step S18, the CPU 10a updates the values of the parameters $C_N$ and $C_P$. Here, the parameters $C_N$ and $C_P$ represent electrolyte concentrations for the anode and the cathode, respectively. The voltage of the voltage source V0 is represented by a function V0 $(C_N, C_P)$ of these parameters $C_N$ and $C_P$. In this step S18, $C_N$ and $C_P$ are obtained from the observed voltage and current, and the parameters $C_N$ and $C_P$ are updated by the obtained values. With the thus-obtained parameters $C_N$ and $C_P$, using the function V0 $(C_N, C_P)$, a measured value (specifically, the terminal voltage V0 of the lead-acid battery 13 measured during the period of $\tau 1$ in FIG. 8) (see step S11) of the aforementioned stable OCV at the initial stage of the start-up time of the lead-acid battery 13 can be determined.

In step S19, the CPU 10a determines whether or not the electric current $I_n$ observed in step S12 satisfies $I_n > 400$ A, and if $I_n > 400$ A (step S19: YES), proceeds to step S20, and if not, proceeds to S21 (step S19: NO). For example, in the period $\tau 2$ shown in FIG. 8, $I_n > 400$ A is satisfied and the CPU 10a proceeds to step S20.

In step S20, the CPU 10a updates a value of the parameter $R0_n$ with a value of the parameter $R0_n$ contained in the state vector $X_{x+1|n+1}$ obtained in step S16. Thus, $R0_n$ takes a new value.

In step S21, the CPU 10a determines whether or not the current $I_n$ observed in step S12 satisfies $300 \text{ A} \geq I_n > 0$ A, and if $300 \text{ A} \geq I_n > 0$ A is satisfied (step S21: YES), proceeds to step S22, and if not (step S21: NO), proceeds to step S23. For example, in FIG. 8, in the periods $\tau 3$ to $\tau 5$, since $300 \text{ A} \geq I_n > 0$ A is satisfied, the process proceeds to step S22.

In step S22, the CPU 10a performs a process of updating the parameters Z1 and Z2. Details of this process will be described later with reference to FIG. 13.

In step S23, the CPU 10a determines whether or not to perform the process repeatedly, and if the process is to be performed repeatedly (step S23: YES), returns to step S10 to repeat a process similar to the process described above, and if not (step S23: NO), proceeds to step S24. For example, the process is repeated until a predetermined time (e.g., several seconds) has elapsed after the engine had been started up, and proceeds to step S24 after the predetermined time has elapsed.

In step S24, the CPU 10a estimates $\Delta Vx$. Specifically, the CPU 10a estimates, using the simulation model 30 with the parameters being updated with an extended Kalman filter operation, the voltage drop ΔVx for a case where the lead-acid battery 13 is discharged with a predetermined electric current pattern. The predetermined electric current pattern can be, for example, determined by adding an electric current pattern for a newly started-up load to the present discharge current.

A specific calculation method can be expressed as follows using the relationship expressed in equation (5) and a value for the specific electric current pattern $Ix_{n+1}$:

$$\Delta V_{x+1} = \Delta Va1_{n+1} + \Delta Va2_{n+1} + \Delta Va3_{n+1} + \Delta Vb1_{n+1} + \Delta Vb2_{n+1} + \Delta Vb3_{n+1} + R0 \cdot Ix_{n+1} \quad (13)$$

Further, as a method of reducing a computational load, although the accuracy is slightly lower than the aforementioned method, a relationship of $\Delta Vx = G(Ra, Rb, Ix)$ such as $\Delta Vx = (Ra+Rb) \times Ix$ or $\Delta Vx = Ra \times Ix$, $\Delta Vx = Rb \times Ix$ may also be obtained empirically for the sake of convenience.

In step S25, the CPU 10a compares the predicted voltage drop ΔVx with a predetermined tolerance ΔVlimit, and if ΔVx is less than or equal to ΔVlimit (step S25: YES), the process proceeds to step S26, and if not (step S25: NO), proceeds to step S27.

In step S26, the CPU 10a determines that the discharge capacity is sufficient. In step S27, the CPU 10a determines that the discharge capacity is insufficient. Then, the process is terminated.

Next, referring to FIG. 13, details of the process in step S22 of FIG. 12 will be described. When the process shown in FIG. 13 is initiated, the following steps are performed.

In step S40, the CPU 10a determines whether or not the current $I_n$ observed in step S12 satisfies 300 A≥$I_n$>200 A, and if 300 A≥$I_n$>200 A is satisfied (step S40: YES), proceeds to step S41, and if not (step S40: NO), proceeds to step S42. For example, within a range of τ3 in FIG. 8, 300 A≥$I_n$>0 A is satisfied and the process proceeds to step S41.

In step S41, the CPU 10a updates the values of the parameters $Ra1_n$, $Rb1_n$, $Ca1_n$ and $Cb1_n$ with the values of parameters contained in the state vector $X_{x+1|n+1}$ derived in step S16. Thus, the parameters $Ra1_n$, $Rb1_n$, $Ca1_n$ and $Cb1_n$ take new values.

In step S42, the CPU 10a determines whether or not the electric current $I_n$ observed in step S12 satisfies 200 A≥$I_n$>100 A, and if 200 A≥$I_n$>100 A is satisfied (step S42: YES), proceeds to step S43, and if not (step S42: NO), proceeds to step S44. For example, within a range of τ4 in FIG. 8, 200 A≥$I_n$>100 A is satisfied and the process proceeds to step S43.

In step S43, the CPU 10a updates the values of the parameters $Ra2_n$, $Rb2_n$, $Ca2_n$ and $Cb2_n$ with the values of parameters contained in the state vector $X_{x+1|n+1}$ derived in step S16. Thus, the parameters $Ra2_n$, $Rb2_n$, $Ca2_n$ and $Cb2_n$ take new values.

In step S44, the CPU 10a determines whether or not the electric current $I_n$ observed in step S12 satisfies 100 A≥$I_n$>0 A, and if 100 A≥$I_n$>0 A is satisfied (step S44: YES), proceeds to step S45, and if not (step S44: NO), gets back (returns) to the original process. For example, within a range of τ5 in FIG. 8, 100 A≥$I_n$>0 A is satisfied and the process proceeds to step S45.

In step S45, the CPU 10a updates the values of the parameters $Ra3_n$, $Rb3_n$, $Ca3_n$ and $Cb3_n$ with the values of parameters contained in the state vector $X_{x+1|n+1}$ derived in step S16. Thus, the parameters $Ra3_n$, $Rb3_n$, $Ca3_n$ and $Cb3_n$ take new values. Then, the process goes back (returns) to the original process.

With the aforementioned processes, the parameters of the simulation model 30 for the lead-acid battery 13 can be adaptively learned by using an extended Kalman filter. Also, when performing adaptive learning, since target parameters are selected based on the value of the discharge current and adaptive learning is performed on the selected parameters, the learning can be carried out accurately and efficiently by performing adaptive learning at the timing where an influence of the parameters is eminent.

(D) Explanation of Configuration of Second Embodiment

FIG. 1 is a diagram illustrating an exemplary configuration of a battery internal state estimating apparatus of a second embodiment of the present invention. As shown in FIG. 1, a battery internal state estimating apparatus 1 of the second embodiment includes, as its main constituent elements, a control unit 10, a voltage detecting unit 11 (corresponds to a part of "actual measurement section" and a part of "observation section" in the claims), a current detecting unit 12 (corresponds to a part of "actual measurement section" and a part of "observation section" in the claims) and a discharging circuit 14, and estimates an internal state of a lead-acid battery 13 (corresponds to "a battery" in the claims). In this exemplary configuration, an alternator 15, a starter motor 16 and a load 17 are connected to the lead-acid battery 13 via the current detecting unit 12. In the second embodiment, an explanation will be made for a case where, for example, a vehicle such as an automobile is equipped with the battery internal state estimating apparatus 1. However, it may be used for other applications.

As shown in FIG. 2, the control unit 10 includes, as its main constituent elements, a CPU (Central Processing Unit) 10a (corresponds to "estimating section" and "adaptive learning section" in the claims), a ROM (Read Only Memory) 10b, a RAM (Random Access Memory) 10c (corresponds to "storing section" in the claims) and an I/F (Interface) 10d (corresponds to "a part of "actual measuring section" and "observing section" in the claims). The CPU 10a controls each part of the apparatus in accordance with a program 10ba stored in the ROM 10b. The ROM 10b is constituted by a semiconductor memory and stores a program 10ba and other information. The RAM 10c is constituted by a semiconductor memory and stores a parameter 10ca and other information in a rewritable manner. The I/F 10d converts and inputs detection signals from the voltage detecting unit 11 and the current detecting unit 12 into digital signals, and supplies a control signal to control the discharging circuit 14.

The voltage detecting unit 11 detects a terminal voltage of the lead-acid battery 13 and notifies the control unit 10 of the terminal voltage. The current detecting unit 12 detects an electric current flowing through the lead-acid battery 13 and informs the control unit 10 of the electric current. The discharging circuit 14 includes, for example, a semiconductor switch, and discharges the lead-acid battery 13 by turning on and off the semiconductor switch under control of the control unit 10. The alternator 15 is, for example, driven by a engine (not shown) such as a reciprocating engine, and charges the lead-acid battery 13 by generating a direct current power. The starter motor 16 is, for example, constituted by a direct current motor, rotates by the direct current supplied from the lead-acid battery 13, and starts up the engine. The load 17 includes devices such as, for example, a head lamp, a wiper, a direction indicator lamp, a navigating device of an automobile.

Figure 14:
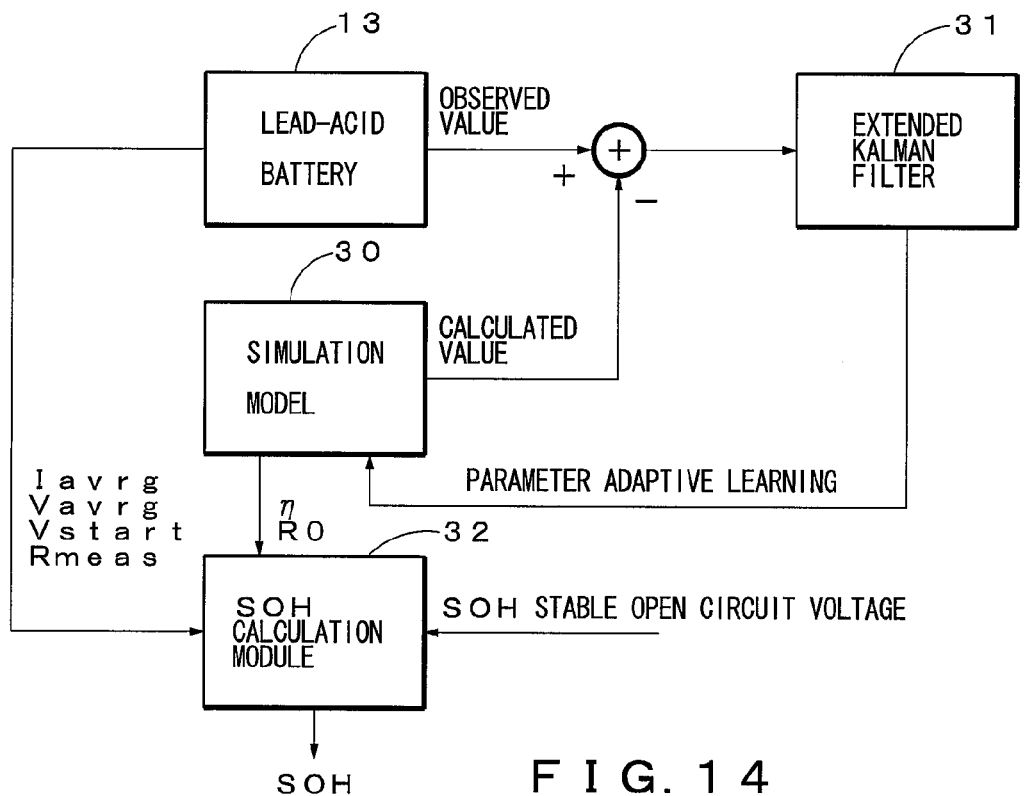
FIG. 14 is a diagram for explaining a process algorithm executed in a second embodiment.

FIG. 14 is a diagram for explaining an outline of a process algorithm which is realized by executing a program 10ba. As shown in FIG. 14, in the second embodiment, a simulation model 30 of the lead-acid battery 13 having a plurality of parameters is created. Then, an observed value is obtained by observing the target lead-acid battery 13 and a calculated value corresponding to the observed value is obtained based on the simulation model 30. By calculating a deviation between these observed values and the calculated values, optimal parameters are estimated by an adaptive learning by an extended Kalman filter 31. Then, using the estimated parameters, the simulation model 30 can be updated and the simulation model 30 can be optimized. An SOH calculation module 32 calculates the SOH by substituting the parameters that have been subjected to an optimum learning ($\eta$, R0), the observed values ($I_{avrg}$, $V_{avrg}$, $V_{start}$ and $R_{meas}$), a value (SOC (State of Charge)) which has been calculated separately from adaptive learning, a stable open circuit voltage (stable OCV (Open Circuit Voltage)) into a predetermined equation described below. Thus, the SOH can be calculated with a high accuracy. The "stable open circuit voltage (Stable OCV)" is an open circuit voltage at an electrochemically equilibrium state and, hereinafter, it will be simply referred to as an "OCV". It is to be noted that the "stable open circuit voltage" need not be in a completely electrochemically equilibrium state and may include a state near equilibrium.

In this specification, "adaptive learning" is similar to that of the aforementioned case.

FIG. 4 is an exemplary diagram illustrating a simulation model 30 (in this example, an electrically equivalent circuit) of a lead-acid battery 13. In this example, the simulation model 30 includes, as its main constituent elements, a resistance R0, an inductance L, impedances Z1, Z2 and a voltage source V0.

Here, the resistance R0 is an internal resistance including, as its main elements, a conductive resistance of electrodes of the lead-acid battery 13 and a solution resistance of the electrolyte. The inductance L is an induced component due to an electric field that is produced by an electric current flowing through electrodes, etc., of the lead-acid battery 13. This inductance L can be neglected, if necessary, since it is a much smaller value compared to an impedance value of a cable connected to the lead-acid battery 13. The impedance Z1 is an equivalent circuit corresponding to a cathode and the electrolyte in contact with the cathode, and basically has a characteristic based on Butler-Volmer's equation and can be expressed as a parallel-connected circuit of the constant phase element CPE1 and the resistance R1. Details of the impedance Z1 will be described later. The impedance Z2 is an equivalent circuit corresponding to an anode of the lead-acid battery 13 and the electrolyte in contact with the anode, and has a characteristic based on the aforementioned Butler-Volmer's equation and can be expressed as a parallel-connected circuit of the constant phase element CPE2 and the resistance R2. Details of the impedance Z2 will also be described later. The voltage source V0 is an ideal voltage having an internal impedance of 0 and its voltage is expressed with the electrolyte concentration $C_N$ in the vicinity of the negative electrode and the electrolyte concentration $C_P$ in the vicinity of the positive electrode being the parameters.

FIG. 5 is a diagram illustrating an impedance characteristic of an equivalent circuit shown in FIG. 4. In FIG. 5, the vertical axis represents an imaginary component (Im(Z)) of the impedance and the horizontal axis represents a real component (Re(Z)) of the impedance. In FIG. 5, a thick line in the graph represents an impedance characteristic of the equivalent circuit. In this example, as the frequency increases, the impedance of the equivalent circuit changes from right to left on the thick line, i.e., firstly it follows a trajectory such that it approaches asymptotically to a semicircle represented by Z1 and then it follows a trajectory such that it approaches asymptotically to a semicircle represented by Z2. Then, it has a characteristic that, at a higher frequency, the real component approaches asymptotically to a straight line of R0 and the impedance increases along with an increase in the frequency due to the impedance L.

Figure 15:
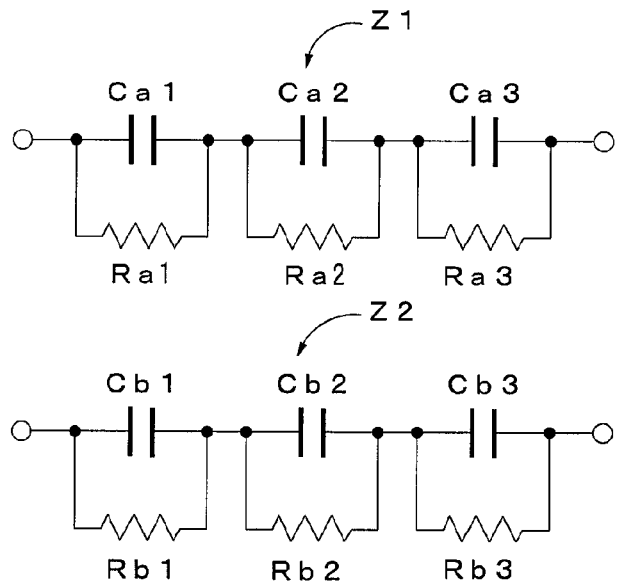
FIG. 15 is a diagram illustrating the equivalent circuit of the CPE illustrating in FIG. 4.

FIG. 15 is a diagram illustrating an equivalent circuit of the impedances Z1, Z2 used in the present embodiment. In this example, the impedance Z1 is formed by a plurality of RC parallel units connected in series, each RC parallel unit including resistances Ra1, Ra2, Ra3 and capacitors Ca1, Ca2, Ca3 connected in parallel, respectively. Specifically, the resistance Ra1 and the capacitor Ca1 are connected in parallel to constitute a single RC parallel unit, and similarly, the resistance Ra2 and the capacitor Ca2 are connected in parallel and the resistance Ra3 and the capacitor Ca3 are connected in parallel to constitute the respective RC parallel units. The impedance Z2 is formed by a plurality of RC parallel units connected in series, each RC parallel unit including resistances Rb1, Rb2, Rb3 and capacitors Cb1, Cb2, Cb3 connected in parallel, respectively.

(E) Explanation of Operation of Second Embodiment

Figure 16:
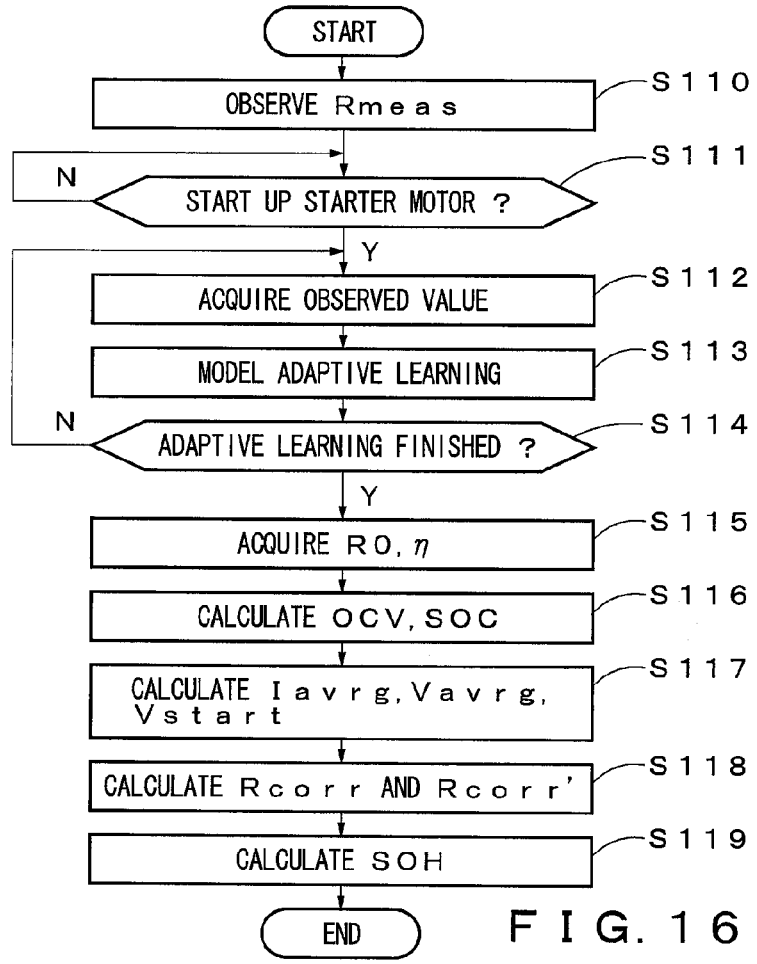
FIG. 16 is a flowchart for explaining the process executed in the second embodiment.

Now, the operation of the second embodiment will be described. FIG. 16 is a flowchart for explaining the process executed in the second embodiment. When the process of this flowchart is initiated, the following steps are carried out.

In step S110, the CPU 10a measures an internal resistance actual measured value $R_{meas}$ in a state where not so much discharge current is flowing from the lead-acid battery 13. Specifically, the CPU 10a drives the discharging circuit 14 by, for example, being triggered by an unlocking of the door lock upon entering into the vehicle, discharges the lead-acid battery 13 at a predetermined cycle (e.g., a cycle of several tens of Hz), and, based on the voltage value and the current value obtained at that time, performs an actual measurement of the internal resistance $R_{meas}$ of the lead-acid battery 13. Also, the internal resistance $R_{meas}$ may be corrected to a reference state based on SOC and a lead-acid battery temperature T. In other words, since the internal resistance $R_{mea}$ is dependent on the SOC and the lead-acid battery temperature T, the actually internal resistance $R_{meas}$ may be corrected using an equation "$R_{meas}'=\alpha \cdot R_{meas}+\beta \cdot SOC+\gamma \cdot T+\delta$", for example. Note that $\alpha$, $\beta$, $\gamma$ and $\delta$ are constants derived by actual measurements, etc. Of course, correction may also be performed using equations other than the abovementioned equation.

In step S111, the CPU 10a determines whether or not the starter motor 16 has been started up, and if the starter motor 16 has been started up (step S111: YES), proceeds to step S112, and if not (step S111: NO), repeats a similar process. For example, in a case where an ignition key has been operated to start the engine, the process proceeds to step S112.

In step S112, the CPU 10a acquires the observed value of the lead-acid battery 13 during the rotation of the starter motor 16 (while the largest load current is flowing). Specifically, the CPU 10a acquires information indicating the terminal voltage of the lead-acid battery 13 which is output from the voltage detecting unit 11 and information indicating the discharge current which is output from the current detecting unit 12, and sequentially stores them into the RAM 10c as the observed value. Also, the acquiring of the observation in step S112 is performed at a predetermined cycle (e.g., 10 ms cycle) and the thus-acquired observed value is retained in the RAM 10c until the calculation of the SOH is completed.

In step S113, the CPU 10a carries out an adaptive learning on parameters constituting the simulation model 30. In the second embodiment, adaptive learning is carried out with an extended Kalman filter. Specifically, a state vector is created which has at least the resistance R0 shown in FIG. 4 and $\eta$ indicating change-in-time of the resistance R0 as the parameters. Based on the previous (=n−1, n being an arbitrary natural number) state vector, the present (=n) state vector is predicted. Further, a more precise state is estimated by updating the state vector based on the present observed value. It is to be noted that apart from those, for example, number of elements of resistances and capacitors constituting the equivalent circuit Z1, Z2 indicated in FIG. 15, the voltage source V0 and $C_N$, $C_P$ may be selected as the parameters of the state vector.

In step S114, the CPU 10a determines whether or not to terminate the adaptive learning process, and if terminating (step S114: YES), the process proceeds to step S115, and if not (step S114: NO), returns to step S112 and repeats similar processes as in the aforementioned case. For example, if the rotation of the starter motor 16 is stopped (or the engine is started up), the process proceeds to step S115.

In step S115, the CPU 10a acquires the parameter R0 and the parameter $\eta$ acquired by adaptive learning in step S112.

In step S116, the CPU 10a calculates the OCV and the SOC. Specifically, the terminal voltage V0 of the lead-acid battery 13 measured immediately before the start-up of the lead-acid battery 13, or the stable open circuit voltage of the lead-acid battery 13 estimated from the charge-discharge state of the lead-acid battery 13 is taken as OCV. Regarding the SOC, there are a method of obtaining by combining the OCV and the current integration value or a method of obtaining by using a current-voltage characteristic (I/V) in an operating environment, and any of those methods may be used. Since the voltage detecting unit 11 has a very high internal resistance and the current hardly flows during the measurement, the voltage measured immediately before the start-up of the lead-acid battery 13 is hardly affected by the resistance R0 and the impedances Z1, Z2. Accordingly, the voltage V0 of the voltage source can be measured.

In step S117, CPU 10a calculates $I_{avrg}$, $V_{avrg}$ and $V_{start}$. Here, $I_{avrg}$ and $V_{avrg}$ are the average current flowing from the lead-acid battery 13 to the load (mainly the starter motor 16) at the time of start-up of the engine by the starter motor 16 and the average voltage across the lead-acid battery 13, respectively, and $V_{start}$ is a voltage across the lead-acid battery 13 immediately before the start-up of the engine by the starter motor 16. Regarding $V_{start}$, a voltage immediately before rotating the starter motor 16 may be measured by the voltage detecting unit 11. Regarding $I_{avrg}$ and $V_{avrg}$, average values of the current values and the voltage values obtained during the rotation of the starter motor 16 and stored in the ROM 10c may be calculated, respectively.

In step S118, the CPU 10a calculates $R_{corr}$ and also calculates $R_{corr}'$ based on the calculated $R_{corr}$. Here, $R_{corr}$ is defined by equation (15) below, using the resistance R0 indicated in FIG. 4, $\eta$ and g( ). Also, as has been described above, $\eta$ is a parameter indicating the change of resistance R0 over time, and has a value near 1 when the lead-acid battery 13 is new, and has a value greater than 1 when degraded over time. Further, g( ) indicates a predetermined function having OCV and $I_{avrg}$ as its variables. Also, for example, g( ) can be expressed by equation (14) described below.

$$g(OCV, I_{avrg}) = 1/(A1 + A2 \cdot OCV)/(A3 + A4 \cdot I_{avrg}) \quad (14)$$

Here, A1 to A4 are predetermined constants (e.g., constants depending on the type of lead-acid battery 13 and derived by actual measurement) and, for example, those pre-stored in the ROM 10b can be read out and used. $R_{corr}$ is expressed by equation (15) described below.

$$R_{corr} = \eta \cdot R0 \cdot g(OCV, I_{avrg}) \quad (15)$$

Next, the CPU 10a calculates $R_{corr}'$ which is a corrected value of $R_{corr}$ in accordance with equation (16) described below.

$$R_{corr}' = R_{corr} + f(SOC, OCV, I_{avrg}, V_{avrg}, V_{start}) \quad (16)$$

Here, f(SOC, OCV, $I_{avrg}$, $V_{avrg}$, $V_{start}$) is, for example, a function expressed as a linear expression of each of the parameters SOC, OCV, $I_{avrg}$, $V_{avrg}$, $V_{start}$ and predetermined constants. Specifically, for example, it can be expressed by equation (17) described below. B1 to B5 are predetermined constants, and, for example, those pre-stored in the ROM 10b may be read out and used. As a specific example, in a case where the 20 hour rate (0.05 C) rating capacity of the lead-acid battery 13 is 60 Ah, B1 to B5 may be $-2.599388 \times 10^{-6}$, $-8.027024 \times 10^{-4}$, $1.388216 \times 10^{-5}$, $-4.602935 \times 10^{-4}$, $-4.872664 \times 10^{-4}$, respectively.

$$f(SOC, OCV, I_{avrg}, V_{avrg}, V_{start}) = B1 \cdot SOC + B2 \cdot OCV + B3 \cdot I_{avrg} + B4 \cdot V_{avrg} + B5 \cdot V_{start} \quad (17)$$

In step S119, the CPU 10a calculates the SOH based on the following equation and terminates the process.

$$SOH = C1 \cdot \eta + C2 \cdot R_{corr}' + C3 \cdot R_{meas} + C4 \quad (18)$$

Also, C1, C2, C3 and C4 are constants obtained in advance (e.g., constants determined based on the type of the lead-acid battery 13 and obtained by actual measurement), and, for example, those pre-stored in the ROM 10b may be read out and used. As a specific example, in a case where the 20 hour rate (0.05 C) rating capacity of the lead-acid battery 13 is 60 Ah, C1 to C4 may be 92.71332, −28252.8, −4879.45, −596.149, respectively.

With the process described above, at the time of the start-up of the starter motor 16, the parameters are optimized by performing adaptive learning on the simulation model 30 and the SOH can be calculated based on those parameters and the actual values using equation (18), which is mentioned above. Hereinafter, based on the result of the experiment, it will be described that the thus-calculated SOH has a very high accuracy.

FIGS. 17 to 19 are diagrams indicating the actual measurement results according the aforementioned second embodiment. FIGS. 20 to 22 are diagrams indicating the actual measurement results for a case where the SOH is estimated according to the related art. Here, according to the related art, the SOH is estimated by the following equation.

$$SOH = C1 \cdot R_{meas} + C2 \quad (19)$$

Here, $R_{meas}$ is the actual measured value of the internal resistance of the lead-acid battery, and C1 and C2 are constants which have been obtained in advance. As a specific example, in a case where the 20 hour rate (0.05 C) rating capacity of the lead-acid battery 13 is 60 Ah, C1 and C2 may be −7026.74106, 117.2042, respectively.

FIG. 17 is a diagram illustrating a dispersion of an estimated SOH and an actual measured SOH of the second embodiment, and FIG. 20 is a diagram illustrating a similar dispersion according to the related art. By comparing these figures, it can be seen that the second embodiment is less dispersed as compared to the related art, since the samples are distributed in such a manner that they are concentrated on a straight line representing that the actual measured value=the estimated value (a 45-degree straight line originating from the origin).

FIG. 18 is a diagram illustrating a distribution of an SOH estimation error of the second embodiment, and FIG. 21 is a diagram illustrating a similar distribution of the related art. In these diagrams, the horizontal axis represents a range of error of SOH and the vertical axis represents a frequency of the samples belonging to each range of error. By comparing these diagrams, it can be seen that, in the related art, a group of samples exists in the range between 100-110% and thus an overall dispersion is greater, whereas in the second embodiment, such a group of samples does not exist and the dispersion is smaller.

FIG. 19A is a chart showing various items regarding an estimation error and a relative estimation error for all the samples according to the second embodiment, and FIG. 22A is a chart showing the measurement results of the related art in a similar manner. Here, the "estimation error" indicates a difference value in Ah between the measured value and the estimated value. The "relative estimation error" indicates the difference value in Ah between the measured value and the estimated value in percentages against the measured value. As can be clearly seen from the comparison between FIG. 19A and FIG. 22A, "maximum error", "minimum error", "average error" and "standard deviation" regarding the estimation error for the entire 81 samples, which were "19.1", "−14.8", "0.2" and "7.8" in the related art, respectively, are improved to "12.1", "−12.9", "−0.3" and "5.0" in the second embodiment. Also, the "maximum error", "minimum error", "average error" and "standard deviation" regarding the relative estimation error, which were "103.7", "−39.4", "5.9" and "30.6", respectively, are improved to "41.6", "−34.2", "1.5" and "14.3", respectively.

FIGS. 19B and 22B indicates "adjusted R square value", which is also referred to as a degree of freedom adjusted coefficient of determination, and it is an index value which is generally considered as having a sufficient estimation accuracy when it is approximately 0.8. As shown in FIG. 19B, in the second embodiment, the corrected R square value is 0.8063, indicating that the estimation accuracy is high. Whereas, in the related art, as shown in FIG. 22B, the corrected R square value is 0.59972, indicating that the estimation accuracy is lower as compared to the present embodiment. From the above comparison, it can be understood that the estimation accuracy of the second embodiment is high.

(F) Explanation of Third Embodiment

The third embodiment differs from the second embodiment in that an equation for calculating the SOH is different. Other configurations are similar to those of the second embodiment. More specifically, in the second embodiment, the SOH is calculated using equation (18), whereas, in the third embodiment, the SOH is calculated using equation (20) described below.

$$SOH = C1 \cdot \eta + C2 \cdot R_{meas} + C3 \tag{20}$$

where

C1, C2 and C3 are constants which are determined in advance (e.g., constants determined depending on the type of lead-acid battery 13 and obtained by actual measurement);

$\eta$ is a parameter indicating a change over time of the resistance R0; and $R_{meas}$ is an actual measured value of the internal resistance.

It is to be noted that $\eta$ and $R_{meas}$ are the same parameters as described above, and C1, C2 and C3 are separately calculated from the aforementioned constants. As a specific example, in a case where the 20 hour rate (0.05 C) rating capacity of the lead-acid battery 13 is 60 Ah, C1, C2 and C3 may be −8.44014, −6576.13129, 124.95939, respectively.

FIGS. 23 to 25B illustrate actual measurement results according to the third embodiment. FIGS. 23 and 24 correspond to FIGS. 20 and 21, respectively, and show a correspondence relationship between the estimated SOH and the actual measured SOH and a distribution of the SOH estimation error, respectively. FIG. 25A indicates the estimation error and the relative estimation error, and FIG. 25B indicates the corrected R square value. By comparing FIGS. 23 and 24 with FIGS. 20 and 21, it can be seen that the third embodiment has improved characteristics in comparison to the related art. Further, by comparing FIGS. 25A, 25B with FIGS. 22A, 22B, it can be seen that the third embodiment is improved over the related art with respect to each of the estimation error, the relative estimation error and the corrected R square value. Thus, it can be understood that a high estimation accuracy is achieved in the third embodiment.

(G) Explanation of Fourth Embodiment

The fourth embodiment differs from the second embodiment in that an equation for calculating the SOH is different. Other constituents are similar to those of the second embodiment. More specifically, in the second embodiment, the SOH is calculated using equation (18), whereas, in the fourth embodiment, the SOH is calculated using equation (21) described below.

$$SOH = C1 \cdot R_{corr} + C2 \cdot R_{meas} + C3 \tag{21}$$

where

C1, C2 and C3 are predetermined constants (e.g., constants determined in accordance with the type of lead-acid battery 13 and obtained by actual measurement);

$R_{corr}$ is expressed by equation (15); and $R_{meas}$ is an actual measured value of the internal resistance.

It is to be noted that $R_{corr}$ and $R_{meas}$ are the same parameters as described above and C1, C2 and C3 are separately calculated from the aforementioned constants. As a specific example, in a case where the 20 hour rate (0.05 C) rating capacity of the lead-acid battery 13 is 60 Ah, C1, C2 and C3 may be −11150.18291, −3748.03312, 142.47629, respectively.

Figures 27, 28A, 28B:
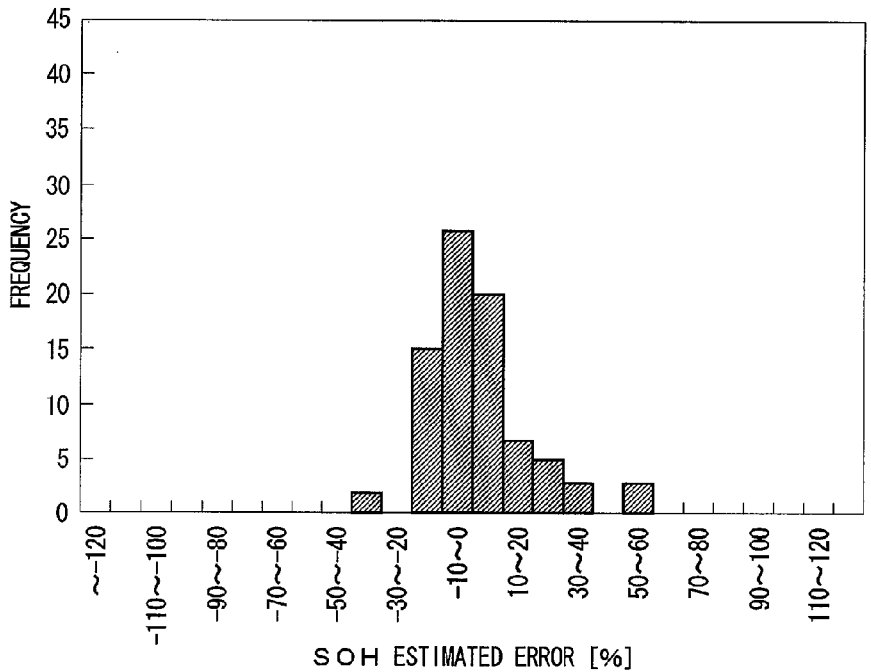
FIG. 27 is a diagram illustrating a relationship between an SOH estimation error and a frequency according to the fourth embodiment.
FIG. 28A illustrates a relationship between the estimation error and a relative estimation error of the fourth embodiment and FIG. 28B illustrates a corrected square R value.

FIGS. 26 to 28B illustrate actual measurement results according to the fourth embodiment. FIGS. 26 and 27 correspond to FIGS. 20 and 21, respectively, and show a correspondence relationship between the estimated SOH and the actual measured SOH and a distribution of the SOH estimation error, respectively. FIG. 28A indicates the estimation error and the relative estimation error, and FIG. 28B indicates the corrected R square value. By comparing FIGS. 27 and 28 with FIGS. 20 and 21, it can be seen that the fourth embodiment has improved characteristics in comparison to the related art. Also, by comparing FIGS. 28A and 28B with FIGS. 22A and 22B, it can be seen that the fourth embodiment is improved over the related art with respect to each of the estimation error, the relative estimation error and the corrected R square value. The corrected R square value is 0.77955, which is improved over the third embodiment. Thus, it can be understood that a high estimation accuracy is achieved in the fourth embodiment.

(H) Explanation of Fifth Embodiment

The fifth embodiment differs from the second embodiment in that an equation for calculating the SOH is different. Other constitutions are similar to those of the second embodiment. More specifically, in the second embodiment, the SOH is calculated using equation (18), whereas, in the fifth embodiment, the SOH is calculated using equation (22) described below.

$$SOH = C1 \cdot \eta + C2 \cdot R_{corr} + C3 \cdot R_{meas} + C4 \qquad (22)$$

where

C1, C2, C3 and C4 are predetermined constants (e.g., constants determined in accordance with the type of lead-acid battery 13 and derived actual measurement);

$\eta$ is a parameter indicating a change over time of the resistance R0;

$R_{corr}$ is expressed by equation (15); and $R_{meas}$ is an actual measured value of the internal resistance.

It is to be noted that $\eta$, $R_{corr}$ and $R_{meas}$ are the same parameters as described above and C1, C2, C3 and C4 are separately calculated from the aforementioned constants. As a specific example, in a case where the 20 hour rate (0.05 C) rating capacity of the lead-acid battery 13 is 60 Ah, C1, C2, C3 and C4 may be 6.89056, −12602.7054, −3688.7988 and 139.4371, respectively.

Figure 29:
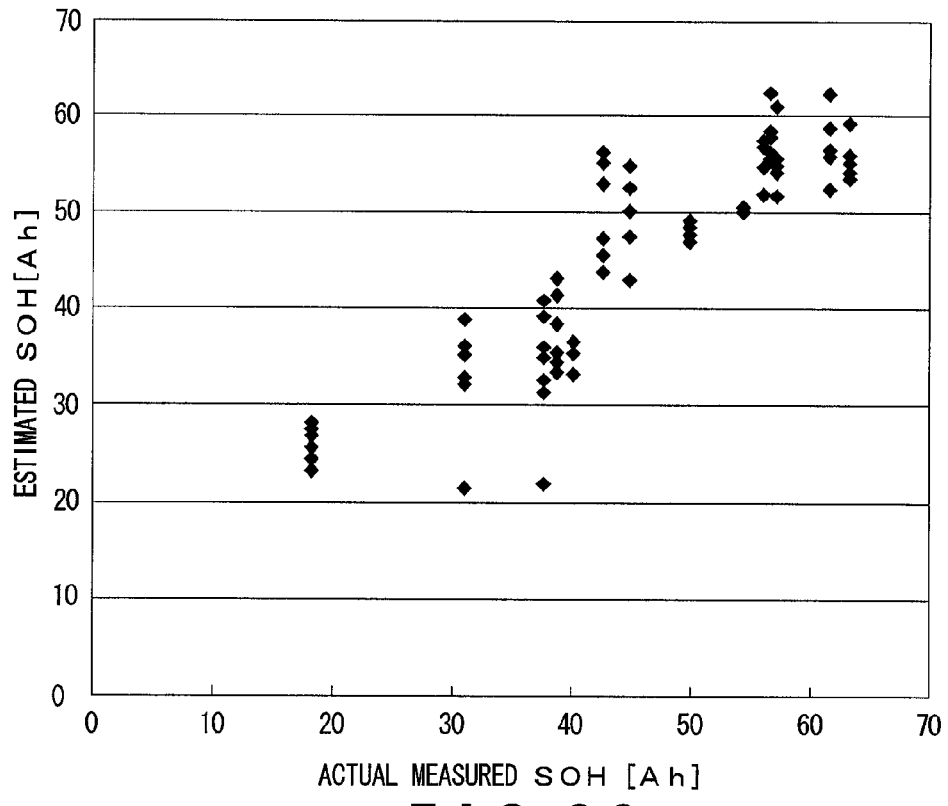
FIG. 29 is a diagram illustrating a distribution of an estimated SOH and a measured SOH according to a fifth embodiment.
Figure 30:
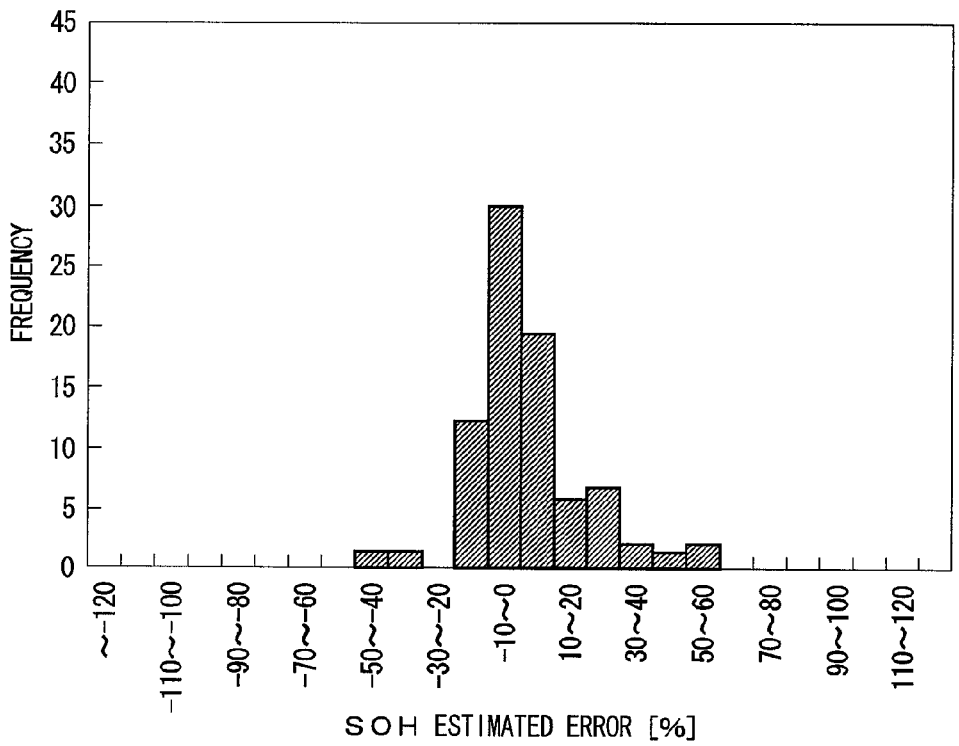
FIG. 30 is a diagram illustrating a relationship between an SOH estimation error and a frequency according to the fifth embodiment.

FIGS. 29 to 31B illustrate actual measurement results according to the fifth embodiment. FIGS. 29 and 30 correspond to FIGS. 20 and 21, respectively, and show a correspondence relationship between the estimated SOH and the actual measured SOH and a distribution of the SOH estimation error, respectively. Also, FIG. 31A indicates the estimation error and the relative estimation error, and FIG. 31B indicates the corrected R square value. By comparing FIGS. 29 and 30 with FIGS. 20 and 21, it can be seen that the fifth embodiment has improved characteristics in comparison to the related art. Also, by comparing FIGS. 31A, 31B with FIGS. 22A, 22B, it can be seen that the fifth embodiment is improved over the related art with respect to each of the estimation error, the relative estimation error and the corrected R square value. Also, the corrected R square value is 0.78603, which is improved over the fourth embodiment. Thus, it can be understood that the estimation accuracy of the fifth embodiment is high.

As has been described with respect to the aforementioned second to fifth embodiments, the SOH may be calculated with an equation in which the actual measured value of the internal resistance $R_{meas}$ as well as one or both of $\eta$ and $R_{corr}$ are used, and the thus-obtained SOH has a higher accuracy than the SOH of the related art which is calculated based on $R_{meas}$ only.

(I) Variant Embodiments

It is to be noted that the aforementioned embodiments have been described by way of example and various other variant embodiments exist. For example, in each of the aforementioned embodiment, adaptive learning is carried out using an extended Kalman filter, but other method may be used. Specifically, adaptive learning may be carried out using a neural network model or a genetic algorithm model.

In each of the aforementioned embodiments, a parameter other than a learning target is not updated, but it is also possible to exclude the parameter other than the learning target from a calculation target of the state vector. This will be described in detail. For example, in a case of a general extended Kalman filter, the following prediction and update are performed repeatedly.

Prediction $$\hat{x}_{n+1|n} = f(\hat{x}_n, u_n, 0) \qquad (23)$$

$$P_{n+1|n} = A_{n+1} P_n A_{n+1} A_{n+1}^T + W_{n+1} Q_n W_{n+1}^T \qquad (24)$$

Update $$K_{n+1} = P_{n+1|n} H_{n+1}^T (H_{n+1} P_{n+1|n} H_{n+1}^T + V_{n+1} R_{n+1} V_{n+1}^T)^{-1} \qquad (25)$$

$$\hat{x}_{n+1} = \hat{x}_{n+1|n} + K_{n+1}(z_{n+1} - h(\hat{x}_{n+1|n}, 0)) \qquad (26)$$

$$P_{n+1} = (I - K_{n+1} H_{n+1}) P_{n+1|n} \qquad (27)$$

In the aforementioned example, in equation (26), only those parameter to be the targets in the state vector $$\hat{x}_{n+1}$$

are updated and other parameters are not updated, but equation (26) may be calculated for only those parameters to be the targets of update. Specifically, in a case where Ra1, Rb1, Ca1 and Cb1 are targets of adaptive learning, when calculating equation (26), it is possible to perform the calculation on those parameters only and not to perform calculation on other parameters. With such a method, since the calculation related to the parameters that are not the targets is skipped, a computational speed can be improved. Also, since a CPU 10a of a lower performance may be used, the production cost of the apparatus can be reduced.

Further, rather than performing the calculation on only the targeted parameters, those parameters to be the targets of update may be weighted with a greater weight than other parameters. For example, when updating each parameter, it is possible to set a weight coefficient W for each parameter, and to provide a greater weighting on the parameter which is a target of update and to provide a smaller weighting on other parameters. Specifically, the parameter to be the target of update may be weighted with w=0.8 and other parameters may be weighted with w=0.2. It is to be noted that the aforementioned numerals are provided solely by way of example and other numerals may of course be used.

Also, in each embodiment described above, it is assumed that the there are two impedances Z1 and Z2. However, for example, it can be assumed that there is only one of them. Also, the impedances Z1 and Z2 are each configured to include three RC parallel units, but the impedances Z1 and Z2 may include different number of RC parallel units. Also, the number of units may be other than three, and may be one, two or four or more. In such a case, depending on the number of units, a number of partitions of $\tau 3$ to $\tau 5$ may be changed. The partitioning into $\tau 3$ to $\tau 5$ shown in FIGS. 8 and 9 are by way of example only, and partitioning may be performed in a different manner.

In each embodiment described above, the discharge current is discharged by the discharging circuit 14. However, since an electric current flowing through the starter motor 16 changes with time, the electric current flowing through the starter motor 16 may be sampled at a predetermined cycle without using the discharging circuit 14. In other words, the discharging circuit 16 may be eliminated and the aforementioned processes may be performed by sampling the current and the voltage during the rotation of the starter motor 16 at a predetermined cycle (e.g., a cycle of 10 mS).

Also, in the aforementioned embodiments, although the concentrations of the electrolyte at the negative electrode and the positive electrode $C_N$, $C_P$ are selected as learning targets, V0 may simply be selected as a learning target. Alternatively, in addition to the concentrations $C_N$ and $C_P$ at the negative electrode and the positive electrode, the concentration of the electrolyte at the separator $C_S$ may be added as a learning target, and V0 may be obtained based on $C_N$, $C_P$ and $C_S$.

In each embodiment described above, the inductance L is neglected, but inductance L may also be added as a learning target. In such a case, for example, adaptive learning can be performed at a portion which is experiencing a large current change (e.g., at the time of start-up of the starter motor 16).

Further, in the aforementioned embodiments, adaptive learning is carried out based on the current flowing through the starter motor 16. However, adaptive learning can be carried out based on the current flowing through other load. For example, in a case where a motor for driving a vehicle exists (e.g., a motor of a hybrid vehicle), adaptive learning may be carried out based on the current flowing through the motor. Also, for example, in a case of a secondary battery for solar power generation used in a general household, currents flowing through various loads used in a household (e.g., an air-conditioning apparatus through which a large current flows at the time of start-up).

Further, in each embodiment described above, constants C1-C4, constants A1-A4 and constants B1-B5 are the constants which are determined in accordance with, for example, the type of lead-acid battery 13 and a usage environment, and can be obtained by actual measurement. Specifically, these can be obtained by using a least square method for a plurality of lead-acid battery samples for which the SOH is known.

Further, in each embodiment described above, specific values have been indicated for constants C1-C4, constants A1-A4 and constants B1-B5, but these values are indicated by way of example and not limited to such a case. Also, for constants C1-C4, constants A1-A4 and constants B1-B5, explanation has been made based on the assumption that they are fixed values, but these may be stored in a rewritable nonvolatile memory so as to be rewritable afterwards as necessary.

Further, in each embodiment described above, the number of parameters used in adaptive learning is different. As the number of parameter used increases, the estimation accuracy of SOH increases while the computation becomes more complicated. Accordingly, depending on the required computational accuracy and the processing capacity of the available resource (processing capacity of the control unit 10), a desired embodiment can be selected from the second to fifth embodiments and used.

Further, in each embodiment described above, although the explanation was made by taking the lead-acid battery as an example, the present invention may be applied to other batteries (e.g., nickel-cadmium battery, etc.) Also, in such a case, the simulation model 30 can be changed in accordance with the type of the battery.

Further, in each embodiment described above, the control unit 10 are constituted by a CPU, a ROM, a RAM, etc., but may also be constituted by a DSP (Digital Signal Processor) and the like.

What is claimed is:

1. A battery internal state estimating apparatus that detects a discharge current flowing from a battery to a load including at least an electric motor for starting up an engine and estimates an internal state of the battery based on an equivalent circuit model of the battery as applied on the discharge current, comprising:
   a memory that stores computer executable instructions corresponding to implementation of the equivalent circuit model comprising a resistance element corresponding to an internal resistance of the battery, the resistance element having a resistance value variable on specification of an inputted parameter;
   a storing section that stores a plurality of parameters of the equivalent circuit model;
   a physical detecting section that detects the discharge current flowing from the battery to the load, wherein the load includes at least an electric motor for starting up an engine;
   a selecting section that selects a parameter indicating a resistance value of the resistance element to be subjected to adaptive learning based on a value of the discharge current detected by the detecting section, wherein the selecting section selects the parameter indicating the resistance value of the resistance element when a peak current which flows at a start-up of the electric motor is detected by the detection section;
   an adaptive learning section that performs adaptive learning on the parameter indicating the resistance value of the resistance element selected by the selecting section;
   updating the resistance value of the resistance element of the circuit model, wherein the resistance value of the resistance element is updated in accordance with the adaptive learning and wherein the internal state of the battery is estimated based at least partly on the updated resistance value of the resistance element; and
   initiating transmission of a signal indicative of the updated resistance value, wherein the signal is used to update the resistance value of the battery.

2. The battery internal state estimating apparatus according to claim 1, wherein the equivalent circuit model has at least a constant phase element (CPE) which is an equivalent circuit of a cathode and an anode of the battery, the constant phase element being represented by an equivalent circuit in which a plurality of RC parallel units are connected in series,
   wherein each RC parallel unit includes a resistance and a capacitor connected in parallel, an element value of each of the resistance and the capacitor constituting each RC parallel unit being taken as a parameter of the plurality of parameters,
   wherein the selecting section selects a predetermined RC parallel unit that has been determined in advance in accordance with the value of the discharge current; and
   the adaptive learning selection performs adaptive learning of the element value of each of the resistance and the capacitor which is selected by the selecting section.

3. The battery internal state estimating apparatus according to claim 1, wherein the parameter selected by the selecting section constitutes a state vector of an extended Kalman filter; and
   wherein the adaptive learning selection performs the adaptive learning on the state vector.

4. The battery internal state estimating apparatus according to claim 1, wherein the storing section comprises random access memory (RAM).

5. The battery internal state estimating apparatus according to claim 1, wherein the physical detecting section comprises a current detecting sensor.

6. The battery internal state estimating apparatus according to claim 1, wherein the selecting section and the adaptive learning section comprises computer executable instructions executed on a computer processing unit (CPU).

7. A battery internal state estimating apparatus that detects a discharge current flowing from a battery to a load including at least an electric motor for starting up an engine and estimates an internal state of the battery based on an equivalent circuit model of the battery as applied on the discharge current, comprising:
  a memory that stores computer executable instructions corresponding to implementation of the equivalent circuit model comprising a voltage source having a corresponding voltage, wherein the voltage of the voltage source is dynamically adjusted based on a concentration value of an electrolyte;
  a storing section that stores a plurality of parameters of the equivalent circuit model;
  a physical detecting section that detects the discharge current flowing from the battery to the load, wherein the load includes at least an electric motor for starting up an engine and wherein the detecting section detects the discharge current at a start-up of the engine by the electric motor;
  a selecting section that selects a parameter indicating the concentration value of the electrolyte to be subjected to adaptive learning based on the discharge current detected by the detecting section, wherein the discharge current detected is substantially zero;
  an adaptive learning section that performs adaptive learning on the parameter indicating the concentration value of the electrolyte selected by the selecting section, and updating the resistance value of the resistance element of the circuit model, wherein the voltage of the voltage source is updated in accordance with the adaptive learning and wherein the internal state of the battery is estimated based at least partly on the updated voltage of the voltage source, and
  initiating transmission of a signal indicative of the updated resistance value, wherein the signal is used to update the resistance value of the battery.

8. The battery internal state estimating apparatus according to claim 7, wherein the equivalent circuit model has at least a constant phase element (CPE) which is an equivalent circuit of a cathode and an anode of the battery, the constant phase element being represented by an equivalent circuit in which a plurality of RC parallel units are connected in series,
  wherein each RC parallel unit includes a resistance and a capacitor connected in parallel, an element value of each of the resistance and the capacitor constituting each RC parallel unit being taken as a parameter of the plurality of parameters,
  wherein the selecting section selects a predetermined RC parallel unit that has been determined in advance in accordance with the value of the discharge current; and
  the adaptive learning selection performs adaptive learning of the element value of each of the resistance and the capacitor which is selected by the selecting section.

9. The battery internal state estimating apparatus according to claim 7, wherein the parameter selected by the adaptive learning section constitutes a state vector of an extended Kalman filter; and
  wherein the adaptive learning selection performs the adaptive learning on the state vector.

10. The battery internal state estimating apparatus according to claim 7, wherein the storing section comprises random access memory (RAM).

11. The battery internal state estimating apparatus according to claim 7, wherein the physical detecting section comprises a current detecting sensor.

12. The battery internal state estimating apparatus according to claim 7, wherein the selecting section and the adaptive learning section comprises computer executable instructions executed on a computer processing unit (CPU).

13. A battery internal state estimating apparatus for measuring a terminal voltage, a discharge current, and an internal resistance of a battery and estimating an internal state of the battery based on an equivalent circuit model of the battery applied on the terminal voltage, the discharge current, and the internal resistance, comprising:
  a memory that stores computer executable instructions corresponding to implementation of the equivalent circuit model comprising an internal resistance of an electric circuit, the internal resistance having a variable resistance value dynamically adjusted based on an inputted parameter;
  a storing section that stores a plurality of parameters of the equivalent circuit model;
  a physical measuring section that measures the terminal voltage and the discharge current of the battery at a predetermined cycle;
  an adaptive learning section that performs adaptive learning on the parameters in accordance with the equivalent circuit model based at least partly on a measurement result of the measuring section;
  an actual measurement section that performs actual measurement of the internal resistance of the battery;
  an estimating section that estimates an SOH (State of Health) indicating a degradation state of the battery based on an actual measured value $R_{meas}$ of the internal resistance of the battery obtained by the actual measurement section and a value of the at least one parameter obtained by the adaptive learning selection or a corrected value of the parameter, wherein the estimating section estimates the degradation state based on the corrected value of the parameter, the corrected value of the parameter being a value obtained by multiplying a parameter R0 indicating the internal resistance of the electric circuit by a parameter η indicating an aging of the internal resistance of the electric circuit, and correcting the value obtained by the multiplication based on an average current $I_{avrg}$ flowing through the load and a stable open circuit voltage; and
  initiating transmission of a signal indicative of the corrected value of the parameter, wherein the signal is used to update the resistance value of the battery.

14. The battery internal state estimating apparatus according to claim 13, wherein the storing section comprises random access memory (RAM).

15. The battery internal state estimating apparatus according to claim 13, wherein the physical detecting section comprises a current detecting sensor.

16. The battery internal state estimating apparatus according to claim 13, wherein the selecting section and the adaptive learning section comprises computer executable instructions executed on a computer processing unit (CPU).

17. A battery internal state estimating apparatus for measuring a terminal voltage, a discharge current, and an internal resistance of a battery and estimating an internal state of the battery based on an equivalent circuit model of the battery applied on the terminal voltage, the discharge current, and the internal resistance, comprising:

a memory that stores computer executable instructions corresponding to implementation of the equivalent circuit model comprising an internal resistance of an electric circuit, the internal resistance having a variable resistance value dynamically adjusted based on an inputted parameter;

a storing section that stores a plurality of parameters of the equivalent circuit model;

a physical measuring section that measures the terminal voltage and the discharge current of the battery at a predetermined cycle;

an adaptive learning section that performs adaptive learning on the parameters in accordance with the equivalent circuit model based at least partly on a measurement result of the measuring section;

an actual measurement section that performs actual measurement of the internal resistance of the battery;

an estimating section that estimates an SOH (State of Health) indicating a degradation state of the battery based on an actual measured value $R_{meas}$ of the internal resistance of the battery obtained by the actual measurement section and a value of at least one parameter obtained by the adaptive learning selection or a corrected value of the parameter, wherein the estimating section estimates the degradation state based on the correction value of the parameter, the correction value of the parameter being a value obtained by multiplying parameter R0 indicating the internal resistance of the electric circuit by a parameter η indicating an aging of the internal resistance of the electric circuit, correcting the value obtained by the multiplication based on an average current $I_{avrg}$ flowing through the load and a stable open circuit voltage, and further correcting the corrected value based on an SOC (State of Charge) indicating a state of charge of the battery, an average voltage $V_{avrg}$ of the battery while the current is flowing through the load, and a voltage $V_{start}$ of the battery at a state before the current flows through the load; and initiating transmission of a signal indicative of the corrected value of the parameter, wherein the signal is used to update the resistance value of the battery.

18. The battery internal state estimating apparatus according to claim 17, wherein the storing section comprises random access memory (RAM).

19. The battery internal state estimating apparatus according to claim 17, wherein the physical detecting section comprises a current detecting sensor.

20. The battery internal state estimating apparatus according to claim 17, wherein the selecting section and the adaptive learning section comprises computer executable instructions executed on a computer processing unit (CPU).

* * * * *